US011526040B2

(12) United States Patent
Maeng et al.

(10) Patent No.: US 11,526,040 B2
(45) Date of Patent: Dec. 13, 2022

(54) DISPLAY DEVICE AND METHOD OF FABRICATING THE SAME

(71) Applicant: Samsung Display Co., LTD., Yongin-si (KR)

(72) Inventors: Hyun Jin Maeng, Seoul (KR); Min Su Jung, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/062,644

(22) Filed: Oct. 5, 2020

(65) Prior Publication Data

US 2021/0263370 A1  Aug. 26, 2021

(30) Foreign Application Priority Data

Feb. 25, 2020  (KR) .......................... 10-2020-0022753

(51) Int. Cl.
*G02F 1/1333*  (2006.01)
*H05K 1/18*  (2006.01)

(52) U.S. Cl.
CPC ....... *G02F 1/133305* (2013.01); *H05K 1/189* (2013.01); *G02F 2202/28* (2013.01); *H05K 2201/10136* (2013.01)

(58) Field of Classification Search
None
See application file for complete search history.

(56) References Cited

U.S. PATENT DOCUMENTS

| 9,723,712 | B2 | 8/2017 | Cho |
| 10,108,032 | B2 | 10/2018 | Moon et al. |
| 2019/0187506 | A1* | 6/2019 | Yun .......................... H05K 1/189 |
| 2020/0004093 | A1* | 1/2020 | Yoo .......................... H01L 24/03 |

FOREIGN PATENT DOCUMENTS

| KR | 10-1216174 | 12/2012 |
| KR | 2016-0028042 | 3/2016 |
| KR | 10-1730847 | 4/2017 |
| KR | 2017-0038338 | 4/2017 |
| KR | 2017-0058497 | 5/2017 |

* cited by examiner

*Primary Examiner* — Richard H Kim
(74) *Attorney, Agent, or Firm* — H.C. Park & Associates, PLC

(57) ABSTRACT

A display device includes: a curved first substrate; a second substrate opposing the first substrate; a plurality of connection pads disposed on a side surface of the first substrate and a side surface of the second substrate; and at least one flexible circuit board including a plurality of projections respectively coupled to the plurality of connection pads, wherein the plurality of projections forms an array of projections along an edge of the side surface of the second substrate.

14 Claims, 19 Drawing Sheets

100: 110, 120, 130
200: 220, BM, OC

DISPLAY DEVICE AND METHOD OF FABRICATING THE SAME

CROSS REFERENCE TO RELATED APPLICATION

This application claims priority from and the benefit of Korean Patent Application No. 10-2020-0022753, filed on Feb. 25, 2020, which is hereby incorporated by reference for all purposes as if fully set forth herein.

BACKGROUND

Field

Exemplary embodiments of the invention relate generally to a display device and, more specifically, to a method for manufacturing a display device.

Discussion of the Background

Display devices become more and more important as multimedia technology evolves. Accordingly, a variety of types of display devices such as organic light-emitting display (OLED) devices and liquid-crystal display (LCD) devices are currently used. Such display devices are used in a variety of applications including mobile electronic devices, e.g., portable electronic devices such as smart phones, smart watches and tablet PCs.

There is a region where a drive IC or other printed circuits are disposed on the outer periphery of the glass substrate of the display device. This region may be referred to as a bezel which is a non-display area where no image is displayed. For a tiled display apparatus in which a number of display devices are arranged in a lattice pattern to form a large screen, the display devices are connected with one another. Therefore, non-display areas are formed where two bezels of adjacent display devices are disposed together.

The above information disclosed in this Background section is only for understanding of the background of the inventive concepts, and, therefore, it may contain information that does not constitute prior art.

SUMMARY

Applicant realized that the non-display areas where two adjacent bezels of adjacent display devices in a tiled display meet hinder the experience of a viewer who sees a disruption in the intended image viewed across the entire tiled display.

Display devices constructed according to the principles and exemplary implementations of the invention significantly reduce the bezel of a curved display device and thereby enhance the viewing experience. For example, flexible circuit boards may be attached to the side surface of the curved display panel to reduce significantly the bezel area.

Methods of fabricating a curved display device according to the principles and exemplary implementations of the invention significantly reduce the bezel area of a curved display device.

Additional features of the inventive concepts will be set forth in the description which follows, and in part will be apparent from the description, or may be learned by practice of the inventive concepts.

According to one aspect of the invention, a display device includes: a curved first substrate; a second substrate opposing the first substrate; a plurality of connection pads disposed on a side surface of the first substrate and a side surface of the second substrate; and at least one flexible circuit board including a plurality of projections respectively coupled to the plurality of connection pads, wherein the plurality of projections forms an array of projections along an edge of the side surface of the second substrate.

The projections may include bumps extending in different directions.

The angles defined by imaginary lines of adjacent ones of the bumps may be substantially constant throughout different regions, wherein the imaginary lines may extend in the directions in which the respective bumps extend.

The at least one flexible circuit board may further include a projection area defined as an area from an edge of a projection disposed at an end of the array of projections to an edge of a projection disposed at an other end of the array of projections along the array of projections, wherein the projection area may partially overlap the side surface of the second substrate, wherein the overlapping area may include a first area disposed on one side of an imaginary center line and a second area disposed on the other side of the imaginary center line, the imaginary center line substantially equally dividing the flexible circuit board and extending in a length direction of the flexible circuit board, and wherein the first area may be substantially equal to the second area.

The first area and second area have shapes that may be substantially symmetrical with respect to the imaginary center line.

The projection area may include a bump area and the projections may include bumps disposed substantially symmetrically with respect to the imaginary center line in the array of the bumps.

The spacing between an outer edge of the projection disposed at one end of the array of projections and an outer edge of the projection disposed at the other end of the array of projections may decrease toward a center of curvature of the second substrate.

The spacing between an outer edge of the projection disposed at one end of the array of projections and an outer edge of the projection disposed at the other end of the array of projections may be substantially uniform throughout different regions.

Adhesive films may be disposed between the projections and the connection pads.

The adhesive films may be disposed to cover the entire connection pads.

The array of projections may have a substantially constant length in a thickness of the second substrate.

The spacing between one edge and the other edge of the flexible circuit board in a direction of the array of projections may be substantially uniform throughout different regions.

The spacing between edges of the flexible circuit board in a direction of the array of projections may decrease toward a center of curvature of the second substrate in an area where the second substrate overlaps with the flexible circuit board.

The at least one flexible circuit board may include a plurality of flexible circuit boards, and wherein the plurality of flexible circuit boards may have a curvature substantially equal to a curvature of the edge of the side surface of the second substrate.

The spacing between adjacent ones of the plurality of flexible circuit boards may be substantially uniform.

The plurality of projections may form the array of projections with substantially the same curvature.

According to another aspect of the invention, a method of fabricating a display device includes the steps of: preparing a curvature jig; preparing a flat panel display panel; curving the flat panel display panel using the curvature jig to create a curved display panel; and attaching a flexible circuit board to a side surface of the curved display panel.

The curvature jig may include a first jig having a concave surface and a second jig having a convex surface.

The step of curving the flat panel display panel may include: placing the flat panel display panel on the concave surface of the first jig; pressing the flat panel display panel using the convex surface of the second jig; and fixing the curved display panel to the curvature jig.

The flexible circuit board may include projections disposed therein, wherein connection pads may be disposed on the side surface of the flat panel display panel, and wherein the attaching the flexible circuit board to the side surface of the curved display panel may include coupling the projections with the connection pads.

The projections may include bumps coupled with the connection pads via adhesive films.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION OF THE EMBODIMENTS

Figure 1:
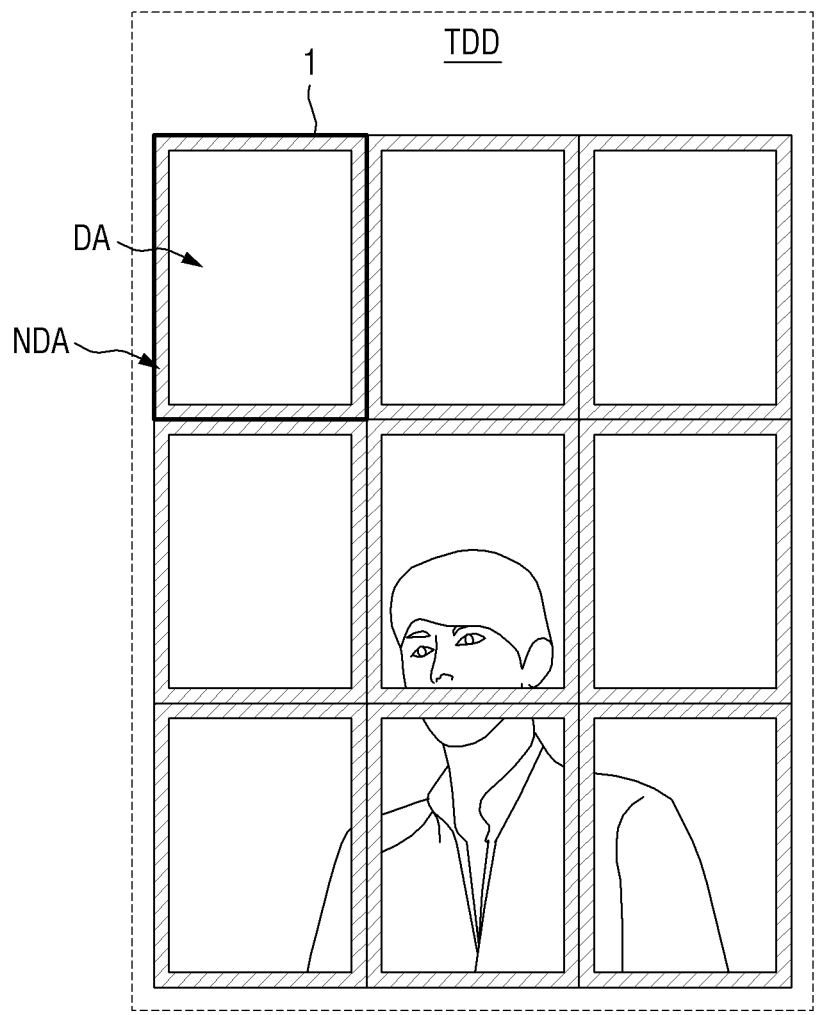
FIG. 1 is a front, elevational view illustrating an exemplary embodiment of a tiled display device constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a front, elevational view illustrating an exemplary embodiment of a tiled display device constructed according to principles of the invention.

As used herein, "above" and "top surface" in the thickness direction may refer to the side of the display device 1 on which images are displayed or the side indicated by the arrow of in the third direction DR3, whereas "below" and "bottom surface" may refer to the opposite side of the display device 1 or the opposite side in the third direction DR3, unless stated otherwise. In addition, "upper side," "lower side," "left side," and "right side" in the plane may be defined when the display surface is viewed from the top. For example, the "left side" may refer to the opposite side to the side indicated by the arrow of the first direction DR1, the "right side" may refer to the side indicated by the arrow of the first direction DR1, the "upper side" may refer to the side indicated by the arrow of the second direction DR2, and the "lower side" may refer to the opposite side to the side indicated by the arrow of the second direction DR2.

The display device 1 may be a self-luminous display device such as an organic light-emitting display device, a quantum-dot light-emitting display device, a micro LED display device and a nano LED display device. Alternatively, the display device 1 may be a non-self-luminous display device such as an electrophoretic display device and an electrowetting display device. In the following description, a liquid-crystal display device including a liquid-crystal layer is employed as the display device, but the exemplary embodiments are not limited thereto. For example, the display device other than a liquid-crystal display device (for example, an organic light-emitting display device) may be employed, in which case some elements described below may be eliminated, or other elements may be added.

A display device 1 according to some exemplary embodiments may be used in a large electronic device such as a television and an electric board, as well as in a small and medium electronic device such as a personal computer, a laptop computer, a vehicle navigation device and a camera, etc. In addition, the display device may be used in a tablet PC, a smart phone, a personal digital assistant (PDA), a portable multimedia player (PMP), a game device, a wristwatch type electronic device, etc. The above-listed electronic devices are merely illustrative and the display device may be employed in other display devices such as tiled display apparatus.

Referring to FIG. 1, a tiled display apparatus TDD may include a plurality of display devices 1. In the exemplary embodiments, the plurality of display devices 1 may be arranged in a lattice pattern, but the exemplary embodiments are not limited thereto. The display devices 1 may be connected in the first direction DR1 or the second direction DR2 or may be connected in a particular pattern. The display devices may have the same size, but the exemplary embodiments are not limited thereto. The display devices may have different sizes.

The plurality of display devices 1 included in the tiled display apparatus TD may have a generally rectangular shape including longer sides and shorter sides. The longer sides or the shorter sides of each of the plurality of display devices 1 may be connected to the longer sides or the shorter sides of adjacent ones of the display devices. Some of the display devices 1 may form the respective sides of the tiled display apparatus TDD, some others of the display devices 1 may be located at the respective corners of the tiled display apparatus TDD to form two adjacent sides, and the rest of the display devices 1 may be located on the inner side of the tiled display apparatus TDD and surrounded by the others of the display devices 1.

Each of the display devices 1 may include a display area DA and a non-display area NDA. The display area DA is where images are displayed. The non-display area NDA is where no image is displayed, i.e., the bezel of the display device 1 and may be disposed around the display area NDA. The non-display area NDA may surround the display area DA, but the exemplary embodiments are not limited thereto. The display devices 1 may have different bezel shapes depending on the locations, or may have the same bezel shape.

The tiled display apparatus TDD may have a generally planar shape, but the exemplary embodiments are not limited thereto. The tiled display apparatus TD may have a three-dimensional shape to give a three-dimensional effect. When the tiled display apparatus TDD has a three-dimensional shape, each of the display devices 1 included in the tiled display apparatus TDD may have a generally curved shape, and may be connected to one another in a generally planar shape or at a predetermined angle, such that the tiled display apparatus TDD may be formed in three-dimensional shape. It is, however, to be understood that the exemplary embodiments are not limited thereto. The tiled distance apparatus TDD may be a generally flat display apparatus.

The bezels of the plurality of display devices 1, which are defined as the non-display areas NDA, may be connected with one another directly. Alternatively, they may be connected with one another by a connecting member. As such, since the display devices 1 are connected with one another in the tiled display apparatus TDD, two bezels of the adjacent display devices 1 are disposed together at the connection portions. Therefore, each of the display devices 1 is required to have a thin bezel. To this end, it is contemplated that a connection pad of a flexible circuit board is connected to the side surface of each of the display devices 1, as described in more detail below. Hereinafter, exemplary embodiments of the display device 1 are described in detail, and may be employed as one of the display devices 1 of the tiled display apparatus TDD or may be used alone.

Figure 2:
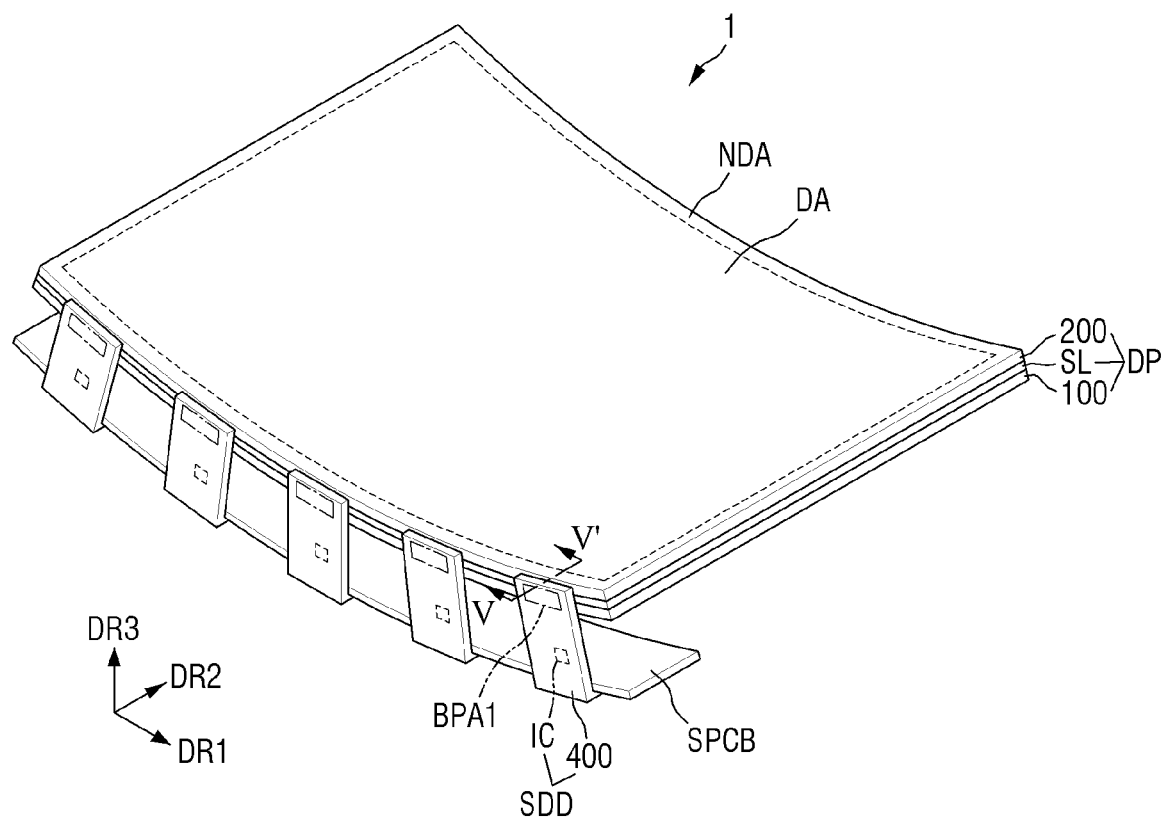
FIG. 2 is a perspective view of an exemplary embodiment of a part of the tiled display device of FIG. 1.
Figure 3:
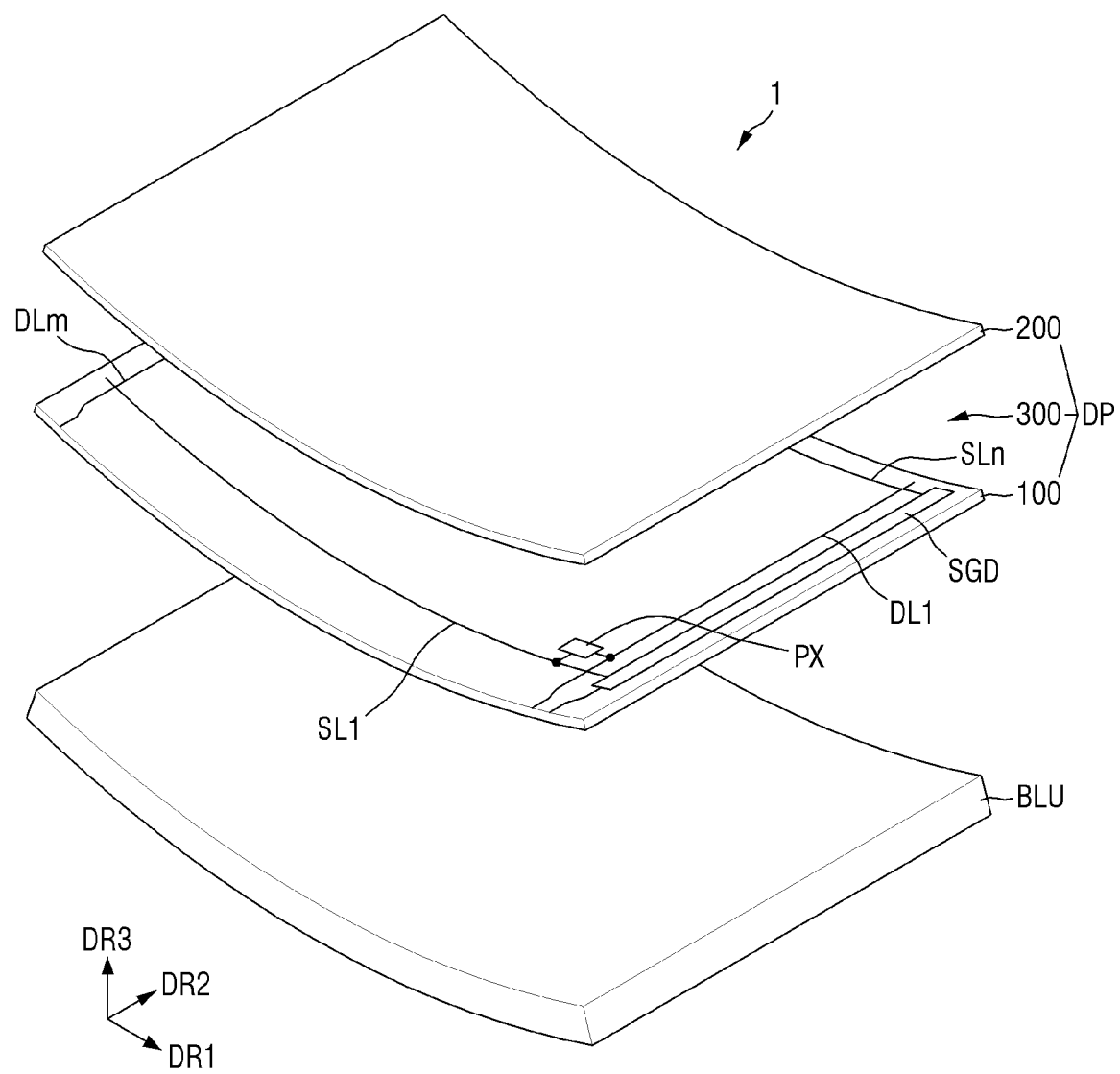
FIG. 3 is an exploded, perspective view of the part of the display device of FIG. 2.
Figure 4:
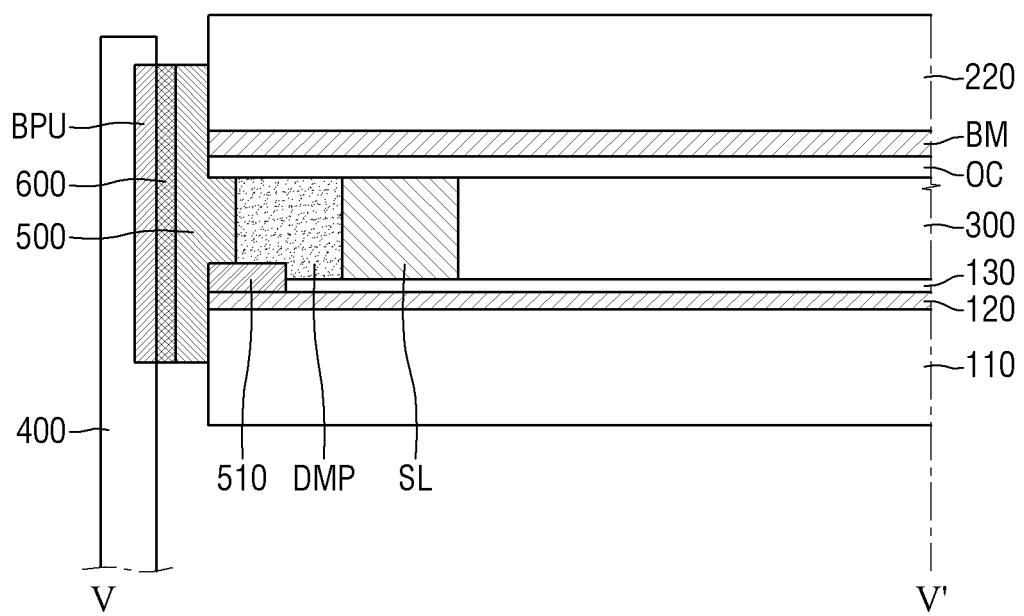
FIG. 4 is a cross-sectional view taken along line V-V' of FIG. 2.
Figure 4:
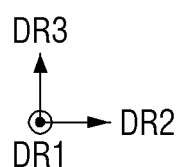

FIG. 2 is a perspective view of an exemplary embodiment of a part of the tiled display device of FIG. 1. FIG. 3 is an exploded, perspective view of the part of the display device of FIG. 2. FIG. 4 is a cross-sectional view taken along line V-V of FIG. 2.

Referring to FIGS. 2 to 4, the display device 1 according to some exemplary embodiments may be a curved display device 1. The curved display device 1 may include a curved display panel DP. According to an exemplary embodiment, the curved display device 1 may be a liquid-crystal display device. In such case, the display panel DP may include a curved first substrate 100, a curved second substrate 200 disposed on the first substrate 100, and a liquid-crystal layer interposed between the first substrate 100 and the second substrate 200. According to another exemplary embodiment, the curved display device 1 may be an organic light-emitting display device. In such case, the display panel DP may include a curved first substrate 100, a curved second substrate 200 disposed on the first substrate 100, and an organic emission layer interposed between the first substrate 100 and the second substrate 200. The second substrate 200 may be an encapsulation substrate or a panel protection member. In the following description, a liquid-crystal display device is employed as the curved display device 1 1, but the exemplary embodiments are not limited thereto.

The shape of the display panel DP may be generally rectangular having longer sides in the first direction DR1 and shorter sides in the second direction DR2 when viewed from the top. However, the shape of the display panel DP is not limited thereto, and may have a curved portion in some regions when viewed from the top.

The display panel DP may have a shape having curved longer sides or curved shorter sides, but the exemplary embodiments are not limited thereto. Both the longer sides and the shorter sides may have a curved shape. Although the display panel DP may have a substantially constant radius of curvature throughout the entire region, the exemplary embodiments are not limited thereto. It may have different radii of curvature for different regions. In the following description, the display panel DP having the curved longer sides will be described as an example.

The first substrate 100 may include a plurality of pixels PX. The plurality of pixels PX may be arranged in a matrix. It is, however, to be understood that the exemplary embodiments are not limited thereto. A plurality of scan lines SL1 to SLn and a plurality of data lines DL1 to DLm may be disposed along the boundaries of the pixels PX, where n and m are natural numbers.

The scan lines SL1 to SLn and the data lines DL1 to DLm may be arranged to intersect each other. The scan lines SL1 to SLn and the data lines DL1 to DLm may be insulated from one another. The scan lines SL1 to SLn may extend in the first direction DR1 to be electrically connected to a gate driver SGD. The data lines DL1 to DLm may extend in the second direction DR2 and may be connected to data drivers SDD.

The pixels PX may be disposed at the respective intersections between the scan lines SL1 to SLn and the data lines DL1 to DLm. Each of the pixels PX may be electrically connected to the scan lines SL1 to SLn and the data lines DL1 to DLm. The plurality of scan lines SL1 to SLn may serve as selection lines for selecting from among the plurality of pixels PXm, where n is a natural number.

Although only one representative pixel PX is depicted in FIG. 3 for convenience of illustration, it is to be understood that a plurality of pixels PX may be disposed in practice. The plurality of pixels PX may be arranged in a matrix. It is, however, to be understood that the exemplary embodiments are not limited thereto. In each of the pixels PX, a representative pixel electrode defining the pixel may be disposed.

A timing controller may receive an image signal and a control signal from an external device. The timing controller may process the image signal and the control signal appropriately for the operating conditions of the display panel DP, thereby generating image data, a first control signal, and a second control signal. The image signal may include a plurality of grayscale data to be transferred to the display panel DP. In addition, the control signal may include a horizontal synchronization signal, a vertical synchronization signal, and a main clock signal. The main clock signal may be used as a reference signal when the timing controller is in synchronization with each of the gate driver SGD and the data drivers SDD for generating various signals.

The gate driver SGD may receive the first control signal from the timing controller. The gate driver SGD may generate a scan signal in response to the first control signal and may output the generated scan signals sequentially. The scan signal may be provided to the pixels PX row-by-row through the scan lines SL1 to SLn. As a result, the pixels PX can be driven row-by-row.

The gate driver SGD may be disposed at a location adjacent to at least one of the shorter sides of the first substrate 100. It is, however, to be understood that the exemplary embodiments are not limited thereto. For example, the gate driver SGD may be formed during a process of fabricating transistors for driving the pixels PX and may be mounted on the first substrate 100 in the form of an amorphous silicon TFT gate driver circuit (ASG) or an oxide silicon TFT gate driver circuit (OSG). It is, however, to be understood that the exemplary embodiments are not limited thereto. The gate driver SGD may be formed of a plurality of driving chips, may be mounted on a flexible driving circuit board, and may be mounted on the first substrate 100 by using tape carrier package (TCP) technique. The gate driver SGD may be formed of a plurality of driving chips and may be mounted on the first substrate 100 by using chip-on-glass (COG) technique.

The data drivers SDD may receive a second control signal and image data from the timing controller. The data drivers SDD may generate a data signal based on the second control signal and image data. The data drivers SDD may provide the generated data signals to the pixels PX through the data lines DL1 to DLm.

The data signals may be provided to the pixels PX through the data lines DL1 to DLm. The pixels PX may receive the data signals D1 to Dm through the data lines DL1 to DLm in response to scan signals provided through the scan lines SL1 to SLn. The pixels PX may represent grayscale levels corresponding to the data signals D1 to Dm, so that the transmittance of the area in which each of the pixels PX is disposed can be controlled.

Each of the data drivers SDD may include a flexible circuit board 400 and a source driving chip IC disposed on the flexible circuit board 400. The flexible circuit board 400 may be disposed adjacent to the side surface of the longer side of the display panel DP to be connected to the display panel DP. It is, however, to be understood that the exemplary embodiments are not limited thereto. The location of the display panel DP where the flexible circuit board 400 is connected may be altered as desired. For example, the flexible circuit board 400 may be disposed adjacent to one of the shorter sides of the display panel DP to be connected to the display panel DP. Alternatively, the flexible circuit board 400 may be disposed on each of the longer sides of the display panel DP. Alternatively, the flexible circuit board 400 may be disposed on each of the shorter sides of the display panel DP. Alternatively, the flexible circuit board 400 may be disposed on each of the longer sides and each of the shorter sides of the display panel DP.

The flexible circuit board 400 may be attached to a connection pad 500 of the display panel DP through an adhesive film 600. For example, an upper bump BPU of the flexible circuit board 400 and the display panel DP may be electrically connected by an outer lead bonding (OLB) using the adhesive film 600. The adhesive film 600 may be disposed to cover the entire connection pad 500 of the display panel DP, but the exemplary embodiments are not limited thereto. A part of the connection pad 500 of the display panel DP may be exposed.

The first substrate 100 may include a first base substrate 110, a connection line 120, and an insulating layer 130. The connection line 120 may be disposed on the first base substrate 110. The connection line 120 may be electrically connected to the scan lines SL1 to SLn and the data lines DL1 to DLm.

The insulating layer 130 may be disposed on the connection line 120. The insulating layer 130 may include a contact hole exposing the connection line 120 near one side of the first substrate 100. The insulating layer 130 may be made of a material including an insulating material. In some exemplary embodiments, the insulating material may be an inorganic insulating material or an organic insulating material. The inorganic insulating material may include at least one of an aluminum oxide, a titanium oxide, a silicon oxide, a silicon oxynitride, a zirconium oxide, and a hafnium oxide. The organic insulating material may include at least one selected from the group consisting of: an acrylic resin, a methacrylic resin, a polyisoprene, a vinyl resin, an epoxy resin, a urethane resin, a cellulose resin, a siloxane resin, a polyimide resin, a polyamide resin, and a perylene resin.

A connection pad 510 may be disposed on the contact hole of the insulating layer 130 and the insulating layer 130 around the contact hole. The connection pad 510 may be in contact with the connection line 120 through the contact hole of the insulating layer 130. Accordingly, the connection pad 510 may be electrically connected to the connection line 120. It is, however, to be noted that the configuration of the connection pad 510 is not limited thereto. For example, the connection pad 510 may be disposed only in the contact hole of the insulating layer 130. In addition, the connection pad 510 may be formed integrally with the connection line 120.

The connection line 120 may extend from the side surface of the first substrate 100 toward the inside (e.g., extending in the second direction DR2) and may be electrically connected to the plurality of pixels PX. The connection pad 500 may be made of, but is not limited to, aluminum (Al), silver (Ag) or the like.

The source driving chip IC mounted on the flexible circuit board 400 may generate data voltages for driving the pixels PX electrically connected through the connection pad 500. The data voltages thus generated may be transmitted to the data lines DL1 to DLm through the connection pad 500 and the connection pad 510.

The flexible circuit board 400 may include the upper bump BPU. The source driving chip IC may be electrically connected to the upper bump BPU of the flexible circuit board 400. The upper bump BPU of the flexible circuit board 400 may be electrically connected to the connection pad 500 disposed on the side surfaces of the first and second substrates 100 and 200 through the adhesive film 600.

Figure 5:
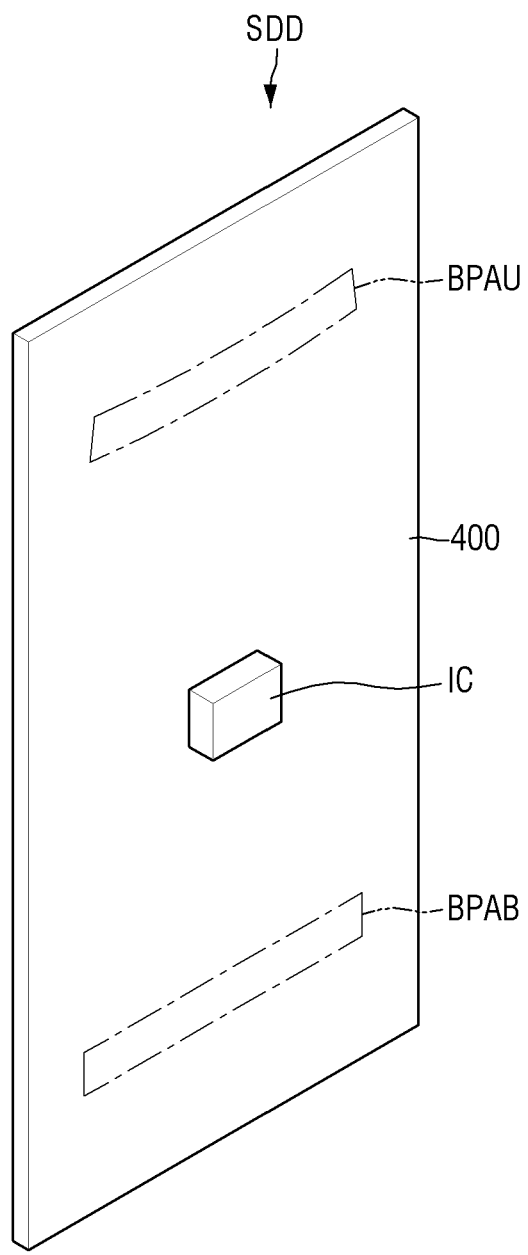
FIG. 5 is a perspective view of an exemplary embodiment of a data driver constructed according to principles of the invention.
Figure 6:
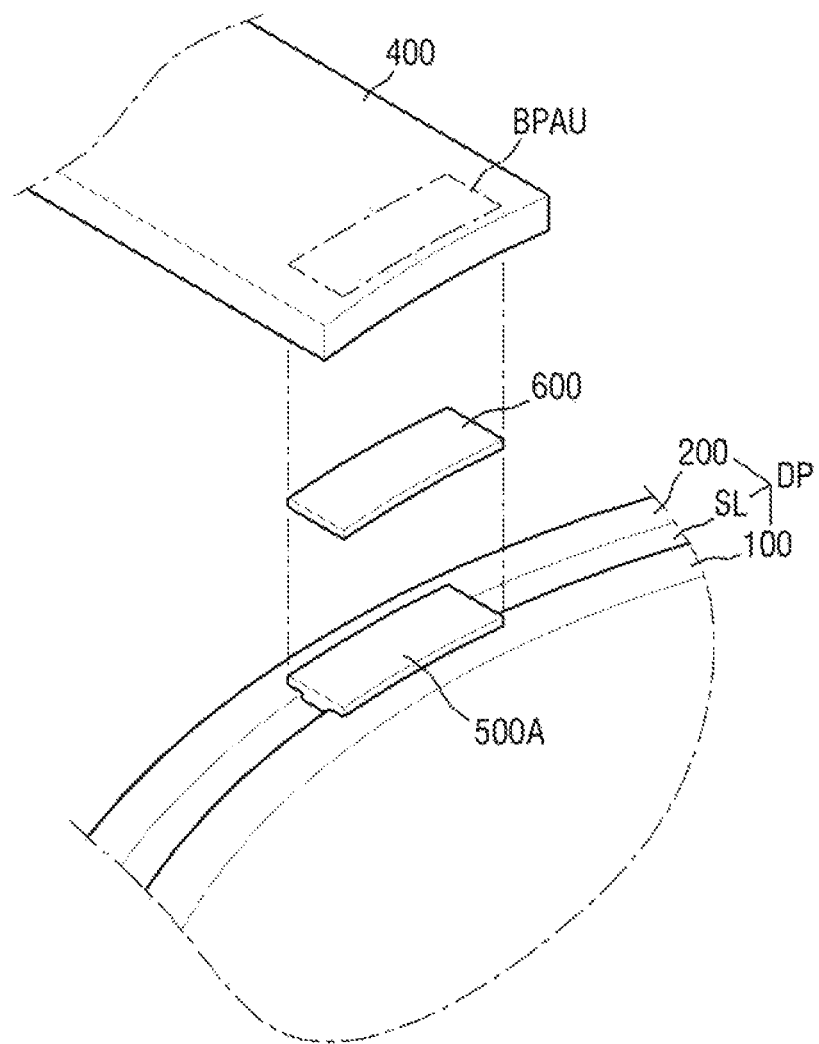
FIG. 6 is an exploded perspective view illustrating an exemplary embodiment of coupling of a display panel and a flexible circuit board according to principles of the invention.
Figure 7:
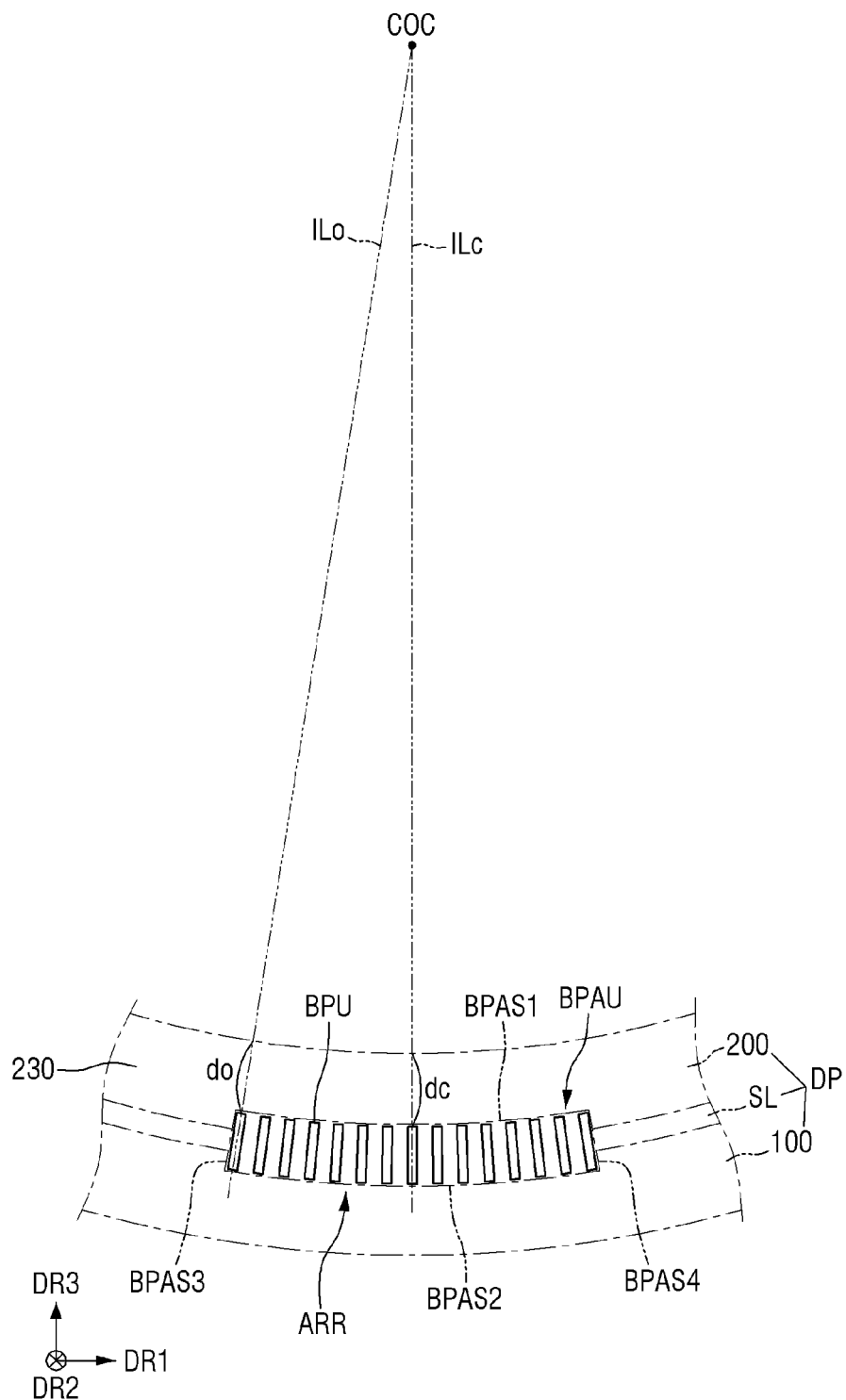
FIG. 7 is a perspective view illustrating an exemplary embodiment of an upper bump area constructed according to principles of the invention.
Figure 8:
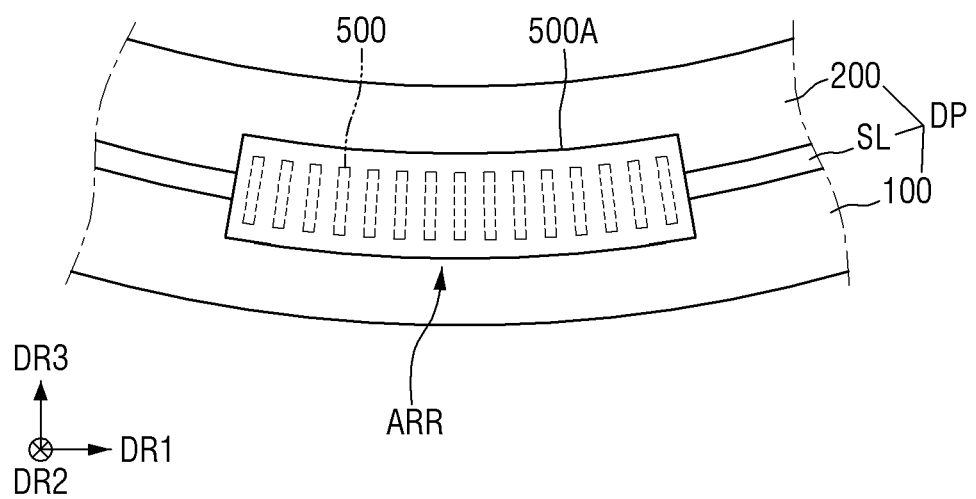
FIG. 8 is an enlarged view illustrating an exemplary embodiment of the side surface of the display panel with the attached connection pad of the display device.

FIG. 5 is a perspective view of an exemplary embodiment of a data driver constructed according to principles of the invention. FIG. 6 is an exploded perspective view illustrating an exemplary embodiment of coupling of a display panel and a flexible circuit board according to principles of the invention. FIG. 7 is a perspective view illustrating an exemplary embodiment of an upper bump area constructed according to principles of the invention. FIG. 8 is an enlarged view illustrating an exemplary embodiment of the side surface of the display panel with the attached connection pad of the display device.

The adhesive film 600 may be disposed between the connection pad 500 and the flexible circuit board 400. The adhesive film 600 may electrically connect the connection pad 500 with the upper bump BPU of the flexible circuit board 400. The adhesive film 600 may be disposed to cover the connection pad 500 and an upper bump area BPAU entirely. The adhesive film 600 may have an area substantially equal to or larger than the area of the upper bump area BPAU and the connection pad 500. The shape of the adhesive film 600 may conform to the shape of the upper bump area BPAU and the connection pad 500 when viewed from the top.

The adhesive film 600 may include an anisotropic conductive film (ACF). When the adhesive film 600 is an anisotropic conductive film, it may have conductivity only in a region where the connection pad 500 of the display panel DP is in contact with and the upper bump BPU of the flexible circuit board 400 to thereby electrically connect them. According to another exemplary embodiment, the connection pad 500 of the display panel DP may be in contact with the upper bump BPU and electrically connected with each other, without the adhesive film 600. For example, the connection pad 500 of the display panel DP may be connected directly to the upper bump BPU of the flexible circuit board 400 by a method such as ultrasonic bonding, welding or laser bonding.

A color filter and a sealant SL may be disposed between the first substrate 100 and the second substrate 200. The color filter may serve to improve the quality of the image output from the display device 1, and the sealant SL may be disposed along the edges of the first and second substrates 100 and 200 on the outer side of the color filter in order to prevent leakage of the liquid-crystal layer 300 disposed between the first and second substrates 100 and 200.

A dummy pattern DMP may be disposed adjacent to the connection pad 500 between the first substrate 100 and the second substrate 200. The dummy pattern DMP may be fixed to the second substrate 200 and may have an end facing the first substrate 100. In addition, the end of the dummy pattern DMP may be in contact with the features on the first substrate 100. For example, the end of the dummy pattern DMP may be in contact with the connection pad 510 and the insulating layer 130. The dummy pattern DMP may extend linearly between one side surface of the first substrate 100 and one side surface of the second substrate 200 when viewed from the top. It is, however, to be understood that the exemplary embodiments are not limited thereto. The dummy pattern DMP may be disposed in the form of an island aligned with the connection pad 500. In addition, the dummy pattern DMP may be disposed on the sides such that it surrounds the edges of the first substrate 100 and the second substrate 200.

The space between the first substrate 100 and the second substrate 200 and the space between the sealant SL and the connection pad 500 may be filled with the dummy pattern DMP. The dummy pattern DMP may be made of, but is not limited to, an insulating material such as an organic insulating material, an inorganic insulating material, and a resin.

The second substrate 200 may be disposed on the first substrate 100. Specifically, the second substrate 200 may be spaced apart from the first substrate 100 in the third direction DR3. The liquid-crystal layer 300 may be disposed between the second substrate 200 and the first substrate 100.

A common electrode for applying an electric field to the liquid-crystal layer 200 together with the pixel electrode of the first substrate 100 may be disposed on the second substrate 300, but the exemplary embodiments are not limited thereto. Both the pixel electrode PE and the common electrode may be disposed on the first substrate 100.

The second substrate 200 may include a second base substrate 220, a black matrix BM, and an overcoat layer OC. The black matrix BM and the overcoat layer OC covering the black matrix BM may be disposed on the second base substrate 220. The black matrix BM may be disposed in a generally lattice pattern when viewed from the top, and can prevent light mixing between adjacent pixels PX and light leakage through a side of the display device 1. The black matrix BM may be made of, but is not limited to, an organic material or a metal material including chromium. A color filter pattern may be further disposed on the second base substrate 220. The color filter pattern may serve to improve the quality of images output from the display device 1. The overcoat layer OC may include an insulating material, and may provide a generally flat surface over the level differences created by the black matrix BM and the color filter pattern. It is, however, to be understood that the exemplary embodiments are not limited thereto. The black matrix BM and the color filter pattern may be disposed on the first substrate 100.

The display device 1 according to some exemplary embodiments may further include a backlight unit BLU. The backlight unit BLU may generate light and may provide the generated light to the display panel DP including the first substrate 100, the second substrate 200 and the liquid-crystal layer 300. The display panel DP may generate an image using light received from the backlight unit BLU and provide it to the outside. The backlight unit BLU may be, for example, an edge-lit backlight unit or a direct-lit backlight unit, but the exemplary embodiments are not limited thereto.

The display device 1 may further include an optical sheet including a polarizing sheet disposed between the backlight unit BLU and the first substrate 100. Such an optical sheet may control the characteristics of light provided from the backlight unit BLU so that the transmittance of light passing through the display panel DP is effectively controlled. In addition, the display device 1 may further include a housing member for accommodating the display panel DP.

The display panel DP according to some exemplary embodiments may be a curved display panel DP having a predetermined curvature. The radius of curvature of the display panel DP may be uniform generally, but the exemplary embodiments are not limited thereto. The display panel DP may have different radii of curvature for different regions. In the display panel DP, one side surface in the third direction DR3 may be generally concave, and the other side surface in the third direction DR3 may be generally convex. A center of curvature COC of the display panel DP may be located at a point spaced apart from the concave surface of the display panel DP in the third direction DR3. For example, for the display panel DP having a generally uniform radius of curvature, the center of curvature COC may be a single point. However, for the display panel DP having different radii of curvature for different regions, there may be different centers of curvature COC for different regions depending on the radii of curvature. Although FIG. 8 shows the display panel DP having a generally uniform radius of curvature and thus having the center of curvature COC of a single point as an example, the exemplary embodiments are not limited thereto.

As depicted in FIGS. 2, 5, the data drivers SDD may include the flexible circuit board 400 and the source driving chip IC disposed on the flexible circuit board 400. The flexible circuit board 400 may include the upper bump area BPAU and the lower bump area BPAB disposed on a surface thereof and at least one area BPAU and BPAB has projections, which may be in the form of bumps, as described below. A plurality of upper bumps BPU may be disposed in the upper bump area BPAU of the flexible circuit board 400. At least one lower bump may be disposed in the lower bump area BPAB of the flexible circuit board 400.

The upper bumps BPU may be the parts of the flexible circuit board 400 that are connected to the display panel DP. Specifically, the upper bumps BPU of the flexible circuit board 400 may be attached to the connection pad 500 disposed on the side surface of the display panel DP through the adhesive film 600 and electrically connected. The source driving chip IC may be electrically connected to the upper bump BPU of the flexible circuit board 400. Therefore, the source driving chip IC may be electrically connected to the display panel DP.

Referring to FIG. 7, the plurality of upper bumps BPU disposed on the flexible circuit board 400 may be arranged with the same curvature as the curvature of the edge 230 of the side surface of the second substrate 200. The length of an array ARR of the upper bumps BPU in the thickness direction of the second substrate 200 may be substantially constant. The upper bump area BPAU may be defined as the area from one edge of the upper bump BPU disposed at one end of the array ARR of the upper bumps BPU to the opposite edge of the upper bump BPU disposed at the opposite end thereof along the array ARR of the upper bumps BPU.

The upper bump area BPAU may be surrounded by first to fourth sides BPAS1 to BPAS4. The first side BPAS1 may be a line connecting the edges of the upper bumps BPU on the upper side in the third direction DR3. The second side BPAS2 may be a line connecting the edges of the upper bumps BPU on the lower side in the third direction DR3. The third side BPAS3 may be the edge of the outermost upper bump BPU disposed on the other side in the first direction DR1. The fourth side BPAS4 may be the edge of the outermost upper bump BPU disposed on the one side in the first direction DR1. Although the first to fourth sides BPAS1 to BPAS4 are spaced apart from the sides of the upper bumps BPU in the example shown in FIG. 7, this is merely illustrative.

The first side BPAS1 may be substantially equally spaced apart from the second side BPAS2 across different regions. It is, however, to be understood that the exemplary embodiments are not limited thereto.

The upper bump area BPAU may have a curved shape such that the side BPAS1 (or the first side) is concave toward the lower side in the third direction DR3 and the opposite side (or the second side) is convex toward the lower side in the third direction DR3. The curvature of the first side BPAS1 and the second side BPAS2 of the upper bump area BPAU may be substantially equal to the curvature of the edge 230 of the side surface of the display panel DP to which the flexible circuit board 400 is attached. For example, the curvature of the first side BPAS1 and the second side BPAS2 of the upper bump area BPAU may be substantially equal to the curvature of the edge 230 of the side surface of the first substrate 100. In addition, the curvature of the first side BPAS1 and the second side BPAS2 of the upper bump area BPAU may be substantially equal to the curvature of the edge 230 of the side surface of the second substrate 200. That is to say, the upper bump area BPAU in which the upper bumps BPAU of the flexible circuit board 400 are disposed may be designed in a variety of ways depending on the curvature of the display panel DP to which the flexible circuit board 400 is attached.

The upper bumps BPU each may have a generally rectangular shape and may extend in different directions. The direction in which the upper bumps BPU extend may be generally inward toward the center of curvature COC of the display panel DP. For example, one edge and the other edge of one of the upper bumps BPU in the first direction DR1 may face the center of curvature COC of the display panel DP.

The shortest distance from one edge of each of the upper bumps BPU on the upper side in the third direction DR3 to the edge of the second substrate 200 on the upper side in the third direction DR3 may have substantially the same value. For example, among the upper bumps BPU disposed in one upper bump area BPAU, the shortest distance dc from the edge of the upper bump BPU disposed at the center to the edge of the second substrate 200 may be substantially equal to the shortest distance do from the edge of the leftmost upper bump BPU to the edge of the second substrate 200.

An imaginary line passing through each of the upper bumps BPU disposed in a upper bump area BPAU and extend generally parallel to the direction in which each of the upper bumps BPU extend may intersect at the center of curvature COC of the display panel DP to which each of the upper bumps BPU is connected. For example, among a plurality of upper bumps BPU disposed in an upper bump area BPAU, an imaginary line ILc passing through the upper bump BPU disposed at the center and extend generally parallel to the direction in which the upper bump BPU extends and an imaginary line ILo passing through the leftmost upper bump BPU and extending in the length direction of the upper bump BPU may intersect at the center of curvature COC of the display panel DP to which the upper bump BPU is attached.

The lower bump area BPAB may have, but is not limited to, a generally rectangular shape. The lower bump area BPAB may be the part of the flexible circuit board 400 that is connected to the driving circuit board SPCB, as depicted in FIG. 2. The flexible circuit board 400 may be implemented in the form of a flexible printed circuit board. Specifically, the flexible circuit board 400 may be implemented as a chip-on film (COF). Accordingly, the data drivers SDD may be connected to the first and second substrates 100 and 200 and the driving circuit board SPCB by a tape carrier package (TCP) technique, and as shown in FIG. 2, the flexible circuit boards 400 may be bent under the rear surface of the second substrate 200 such that the driving circuit board SPCB may be located on the rear surface of the second substrate 300. In such case, the source driving chip IC may be disposed between the second substrate 200 and the flexible circuit board 400, but the exemplary embodiments are not limited thereto. The source driving chip IC may be disposed on the opposite surface of the flexible circuit board 400.

The source driving chip IC may be disposed substantially at the center of the flexible circuit board 400. The source driving chip IC may be disposed between the upper bump area BPAU and the lower bump area BPAB. The source driving chip IC may include a shift register, a latch, a digital-to-analog converter, etc. One data driver SDD may include a single source driving chip IC or a plurality of source driving chips IC. Although one source driving chip IC is disposed on the flexible circuit board 400 of the data driver SDD in the exemplary embodiment shown in the drawing, the exemplary embodiments are not limited thereto. In addition, although the display device 1 according to some exemplary embodiments includes five data drivers SDD, it will be understood that the number is not limited to five.

As described above, the connection pads 500 may be disposed on the side surface of the display panel DP. The plurality of connection pads 500 of the display panel DP may be arranged in a row along the side surface of the display panel DP to form a curve, but the exemplary embodiments are not limited thereto. They may be arranged in a matrix. The arrangement of the connection pads 500 arranged in a row may be curved with substantially the same curvature as the edge of the side surface of the display panel DP. For example, the array ARR of the connection pads 500 may have substantially the same curvature as the edge of the side surface of the first substrate 100. In addition, the array ARR of the connection pads 500 may have substantially the same curvature as the edge of the side surface of the second substrate 200. It is, however, to be understood that the exemplary embodiments are not limited thereto.

As shown in FIG. 8, a connection pad area 500A may be defined by an imaginary line surrounding the array ARR of the connection pads 500 arranged in a row. Alternatively, the connection pad area 500A may be defined by an imaginary line surrounding and spaced apart from the array ARR of the connection pads 500 by a predetermined spacing distance.

The connection pads 500 may have substantially the same shape as the shape of the upper bumps BPU connected thereto. For example, the connection pads 500 each may have a generally rectangular shape and may extend in different directions. The direction in which the connection pads 500 extend may be generally toward the center of curvature COC of the display panel DP. For example, one edge and the other edge of one of the connection pads 500 in the first direction DR1 may face the center of curvature COC of the display panel DP.

Figure 9:
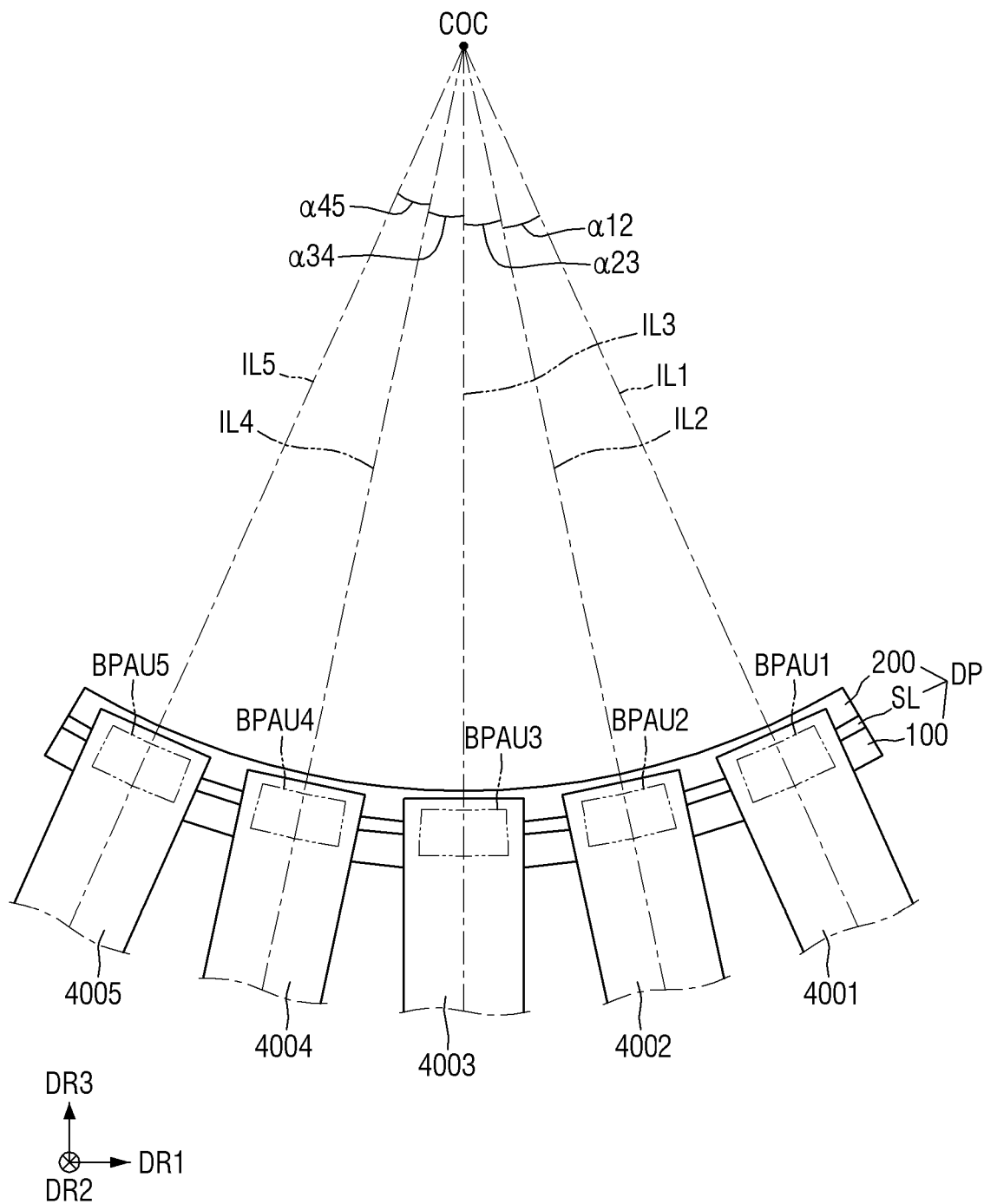
FIG. 9 is a plan view showing an exemplary embodiment of an area with attached flexible circuit boards of the display device constructed according to principles of the invention.
Figure 10:
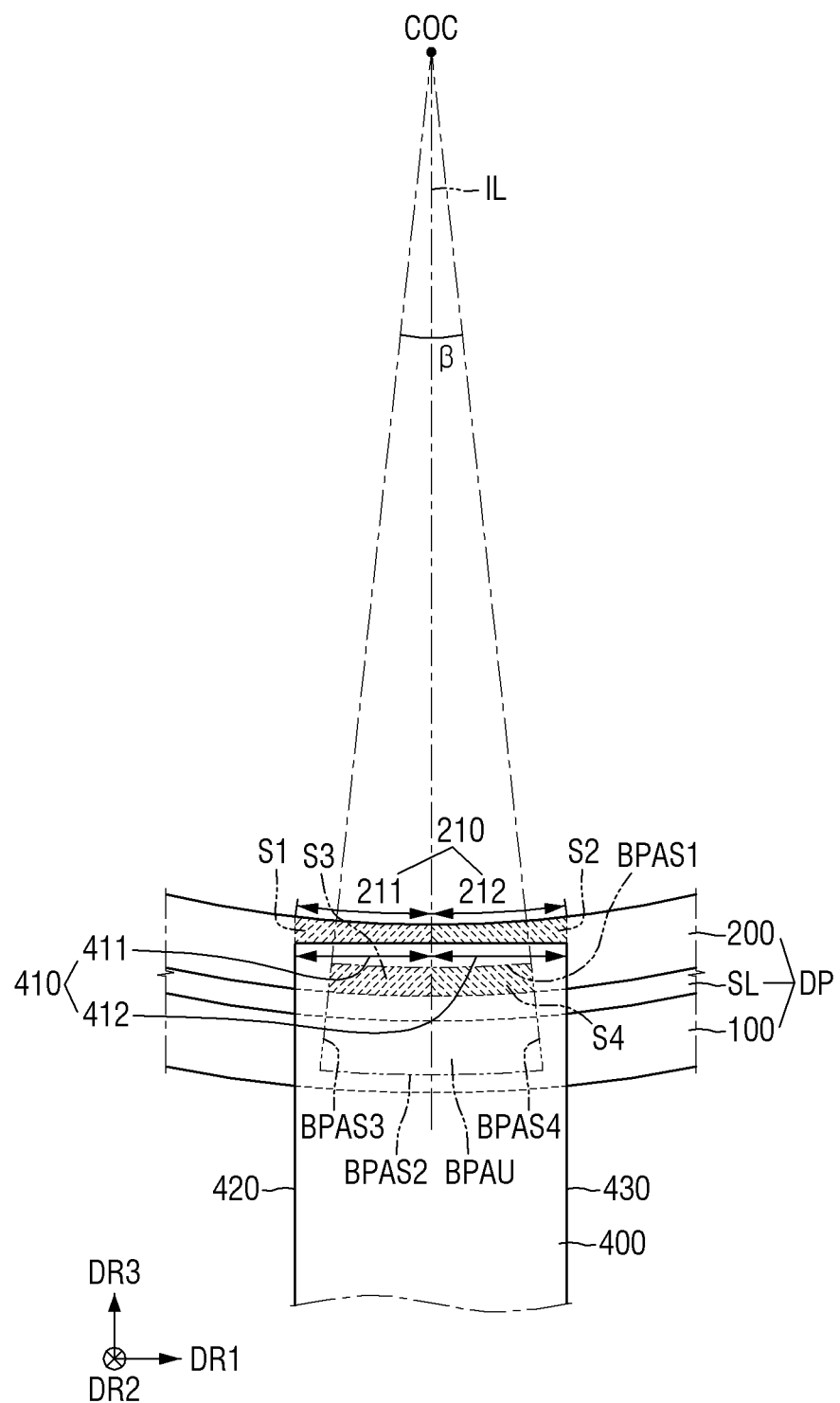
FIG. 10 is an enlarged view of the area of FIG. 9 with one of the attached flexible circuit boards.

FIG. 9 is a plan view showing an exemplary embodiment of an area with attached flexible circuit boards of the display device constructed according to principles of the invention. FIG. 10 is an enlarged view of the area of FIG. 9 with one of the attached flexible circuit boards.

For convenience of illustration, although FIGS. 9 and 10 show the flexible circuit boards 400 in which the upper bump areas BPAU are disposed, the upper bumps BPU may be disposed in each of the upper bump areas BPAU as described above with reference to FIG. 7.

Referring to FIGS. 9 and 10, first to fifth flexible circuit boards 4001 to 4005 may be arranged sequentially on the side surface of the display panel DP and spaced apart from one another from one side to the other side in the first direction DR1. Conforming to the curved display panel DP, the first to fifth flexible circuit boards 4001 to 4005 may be disposed such that they may extend generally toward the center of curvature COC of the display panel DP.

The flexible circuit boards 4001 to 4005 on the side surface of the display panel DP may not protrude above the upper side of the display panel in the third direction DR3. Specifically, when viewed from the top, the edge of each of the flexible circuit boards 4001 to 4005 on the upper side in the third direction DR3 may be aligned with the edge of the display panel DP on the upper side in the third direction DR3 or may be disposed on the inner side of the display panel DP. In the following description, the display panel DP having five flexible circuit boards 4001 to 4005 attached to the side surface will be described as an example. It is, however, to be understood that the number of flexible circuit boards 4001 to 4005 attached to the side surface of the display panel DP is not limited to five.

First to fifth center lines IL1 to IL5 may be defined in the flexible circuit boards 4001 to 4005, respectively, which are imaginary lines that substantially equally divide the respective flexible circuit boards 4001 to 4005 and penetrate the display panel DP in the thickness direction in the side view. The first to fifth center lines IL1 to IL5 may pass through the same center of curvature COC. However, when the display panel DP has different radii of curvature for different regions in which the first to fifth flexible circuit boards 4001 to 4005 are disposed, the first to fifth center lines IL1 to IL5 may pass through different centers of curvature COC.

The adjacent angles $\alpha 12$ to $\alpha 45$ defined as the angles between adjacent ones of the center lines IL1 to IL5 may be substantially equal to one another. For example, the adjacent angle $\alpha 12$ formed as the first and second center lines IL1 and IL2 intersect, the adjacent angles $\alpha 23$ formed as the second and third center lines IL2 and IL3 intersect, the adjacent angle $\alpha 34$ formed as the third and fourth center lines IL3 and IL4 intersect, and the adjacent angle $\alpha 45$ formed as the fourth and fifth center lines IL4 and IL5 intersect may have the same value. It is, however, to be understood that the exemplary embodiments are not limited thereto. The adjacent angles $\alpha 12$ to $\alpha 45$ may have different values.

The spacing distance between the adjacent ones of the first to fifth flexible circuit boards 4001 to 4005 may be defined as the distance between points at which the first to fifth center lines IL1 to IL5 overlap the edges of the flexible circuit boards 4001 to 4005 in the third direction DR3 in the side view of FIG. 8. The spacing distances between the adjacent ones of the first to fifth flexible circuit boards 4001 to 4005 may be substantially constant. It is, however, to be understood that the exemplary embodiments are not limited thereto. The distances may be different from one another.

As described above, the flexible circuit boards 4001 to 4005 may include the first to fifth upper bump areas BPAU1 to BPAU5, respectively. The upper bump areas BPAU1 to BPAU5 may be disposed on the side surfaces of the flexible circuit boards 4001 to 4005 that face the display panel DP, respectively. That is to say, the upper bump areas BPAU1 to BPAU5 may be disposed on the side surfaces of the flexible circuit boards 4001 to 4005 in the second direction DR2, respectively. In addition, in the side view of FIG. 10, the upper bump areas BPAU1 to BPAU5 may overlap the side surface of the display panel DP in the second direction DR2. Specifically, the upper bump areas BPAU1 to BPAU5 partially overlaps with the side surface of the second substrate 200 in the second direction DR2, and partially overlaps with the side surface of the first substrate 100 in the second direction DR2.

Referring to FIGS. 7 and 10, the upper bump area BPAU may be surrounded by a first side BPAS1 disposed on the upper side in the third direction DR3, a second side BPAS2 disposed on the lower side in the third side DR3 from the first side BPAS1, a third side BPAS3 connecting the first side BPAS1 with the second side BPAS2 on the other side in the first direction DR1, and a fourth side BPAS4 connecting the first side BPAS1 with the second side BPAS2 on one side in the first direction DR1. The first and second sides BPAS1 and BPAS2 may be spaced apart from the edges of the side surface of the first and second substrates 100 and 200 across different regions. It is, however, to be understood that the exemplary embodiments are not limited thereto.

The shape of the upper bump area BPAU may conform to the shape of the connection pad area 500A disposed on the side surface of the curved display panel DP. The connection pad area 500A may have a curved shape according to the curvature of the area of the display panel DP where the connection pads 500 are attached. In order to make sure that the upper bumps BPU overlap with the connection pads 500, the shape of the upper bump area BPAU may conform to the shape of the connection pad area 500A attached thereto. As the upper bump area BPAU and the connection pads 500 overlap each other reliably, the adhesion between the flexible circuit boards 400 and the display panel DP can be increased, thereby reducing the stress between them. Therefore, the flexible circuit boards 400 can be effectively attached on the side surface of the display panel DP.

The tangent line of the first side BPAS1 at the point at which the first side BPAS1 intersects the center line IL may be generally perpendicular to the center line IL. Likewise, the tangent line of the second side BPAS2 at the point at which the second side BPAS2 intersects the center line IL may be generally perpendicular to the center line IL. It is, however, to be understood that the exemplary embodiments are not limited thereto.

The imaginary line extending along the third side BPAS3 and the imaginary line extending along the fourth side BPAS4 may extend toward the center of curvature COC of the display panel DP. The imaginary line extending along the third side BPAS3 and the imaginary line extending along the fourth side BPAS4 may pass through the center of curvature COC of the display panel DP. The imaginary line extending along the third side BPAS3 and the imaginary line extending along the fourth side BPAS4 may intersect at the center of curvature COC to form a center angle β. The imaginary line IL may substantially equally divide the central angle β.

The tangent line of the second side BPAS2 at the point at which the second side BPAS2 intersects the third side BPAS3 may be generally perpendicular to the third side BPAS3. Likewise, the tangent line of the second side BPAS2 at the point at which the second side BPAS2 intersects the fourth side BPAS4 may be generally perpendicular to the fourth side BPAS4. It is, however, to be understood that the exemplary embodiments are not limited thereto.

The upper side 410 (or the side in the third direction DR3) of the flexible circuit board 400 may be substantially equally divided by the center line IL and may include first and second upper sides 411 and 412. The left side 420 of the flexible circuit board 400 (or the edge on the other side in the first direction DR1) may be bent and extended toward the lower side in the third direction DR3 from the end of the upper side 410 (or the edge on the upper side in the third direction DR3) of the flexible circuit board 400 on the other side in the first direction DR1. The right side 430 of the flexible circuit board 400 (or the edge on the one side in the first direction DR1) may be bent and extended toward the lower side in the third direction DR3 from the end of the upper side 410 (or the edge on the upper side in the third direction DR3) of the flexible circuit board 400 on the one side in the first direction DR1. The left side 420 (or the edge on the other side in the first direction DR1) of the flexible circuit board 400 may be generally parallel to the right side 430 (or the edge on the one side in the first direction DR1) of the flexible circuit board 400. Accordingly, the spacing distance between the left side 420 (or the edge on the other side in the first direction DR1) of the flexible circuit board 400 the right side 430 (or the edge on the one side in the first direction DR1) of the flexible circuit board 400 may be substantially uniform throughout different regions.

In the side view of FIG. 10, the part of the upper side 210 of the second substrate 300 (or the edge on the upper side in the third direction DR3 between the point at which the image line extending along the left side 420 (or the edge on the other side in the first direction DR1) of the flexible circuit board 400 intersects and the point at which the image line extending along the right side 430 (or the edge on the side in the first direction DR1) of the flexible circuit board 400 intersects is substantially equally divided into first and second parts 211 and 212 by the center line IL.

In the side view, a first area S1 may be defined by the imaginary line extending along the left side 420 of the flexible circuit board 400 (or the edge on the other side in the first direction DR1), the upper side 410 of the flexible circuit board 400 (or the edge on the upper side in the third direction DR3), the center line, and the upper side 210 of the second substrate 200 (or the edge on the upper side in the third direction DR3). In addition, a second area S2 may be defined by the imaginary line extending along the right side 430 of the flexible circuit board 400 (or the edge on the side in the first direction DR1), the upper side 410 of the flexible circuit board 400 (or the edge on the upper side in the third direction DR3), the center line, and the upper side 210 of the second substrate 200 (or the edge on the upper side in the third direction DR3).

In addition, in the side view, some regions of the side surface of the second substrate 200 that is disposed the imaginary line extending along the left side 420 of the flexible circuit board 400 and the imaginary line extending along the right side 430 may include an overlapping portion overlapping with the flexible circuit board in the second direction DR2 and non-overlapping portions S1 and S2. The non-overlapping portions S1 and S2 may include a first area S1 disposed on the other side in the first direction DR1 with respect to the center line IL and a second region S2 disposed on the one side.

In the side view, the first region S1 may not overlap with the flexible circuit board 400 in the second direction DR2 on the side surface of the display panel DP disposed between the imaginary line extending along the left side 420 of the flexible circuit board 400 (or the edge on the other side in the first direction DR1) and the center line IL. In the side view, the second region S2 may not overlap with the flexible circuit board 400 in the second direction DR2 on the side surface of the display panel DP disposed between the imaginary line extending along the right side 420 of the flexible circuit board 400 (or the edge on the one side in the first direction DR1) and the center line IL.

The first region S1 and the second region S2 may be in contact with each other. The first region S1 may be disposed on the other side of the second region S2 in the first direction DR1, and the second region S2 may be disposed on one side of the first region S1 in the first direction DR1. For example, one side of the first region S1 in the first direction DR1 may form the other side of the second region S2 in the first direction DR1, and the other side of the second region S2 in the first direction DR1 may form one side of the first area S1 in the first direction DR1. The area of the first region S1 may be substantially equal to the area of the second region S2. The first region S1 and the second region S2 may be substantially symmetrical with respect to the center line IL.

The upper bump area BPAU and the second substrate 200 may overlap each other in the second direction DR2. The region where the upper bump area BPAU overlaps with the second substrate 200 in the second direction DR2 may include a third region S3 disposed on the other side of the center line IL in the first direction DR1 and a fourth region S4 disposed on one side thereof in the first direction DR1.

The third region S3 and the fourth region S4 may be in contact with each other. The third region S3 may be disposed on the other side of the fourth region S4 in the first direction DR1, and the fourth region S4 may be disposed on one side of the third region S3 in the first direction DR1. For example, one side of the third region S3 in the first direction DR1 may form the other side of the fourth region S4 in the first direction DR1, and the other side of the fourth region S4 in the first direction DR1 may form one side of the third area S3 in the first direction DR1. The area of the third region S3 may be substantially equal to the area of the fourth region S4. The third region S3 and the fourth region S4 may be substantially symmetrical with respect to the center line IL. In addition, the shape of the upper bumps BPU disposed in the upper bump area BPAU may be substantially symmetrical with respect to the center line IL. It is, however, to be understood that the exemplary embodiments are not limited thereto.

In the display device 1 flexible circuit boards 400_1 are attached to the side surface of the curved display panel DP, so that the bezel can be reduced significantly. When one side and the other side of the upper bump area BPAU in the third direction DR3 which are included in the flexible circuit board 400 are generally parallel to the edge of the side surface of the curved display panel DP, the curved display panel DP and the flexible circuit boards 400 can be attached together reliably.

According to the exemplary embodiments, it is possible to significantly reduce the bezel of a curved display device.

Figure 11:
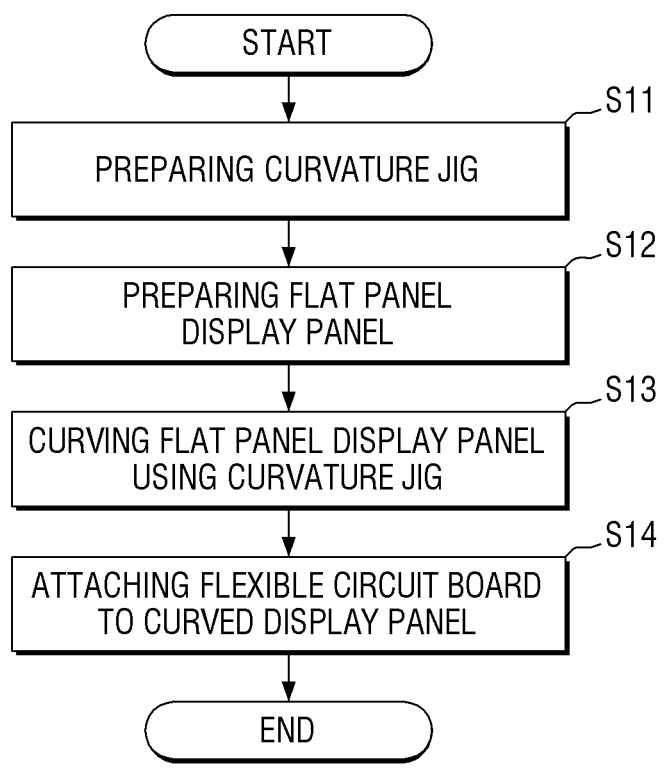
FIG. 11 is a flowchart for illustrating an exemplary embodiment of a method for fabricating the display device according to principles of the invention.
Figure 12:
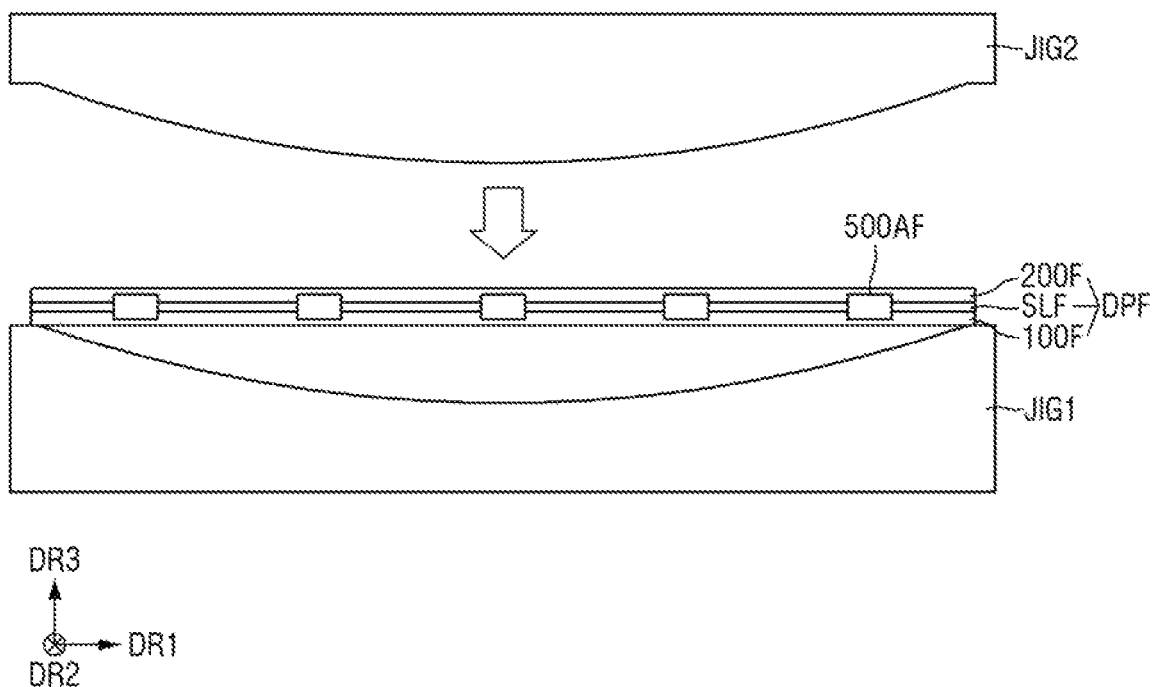
FIGS. 12 to 14 are cross-sectional views for illustrating the method of fabricating the display device according to the flowchart of FIG. 11.
Figure 13:
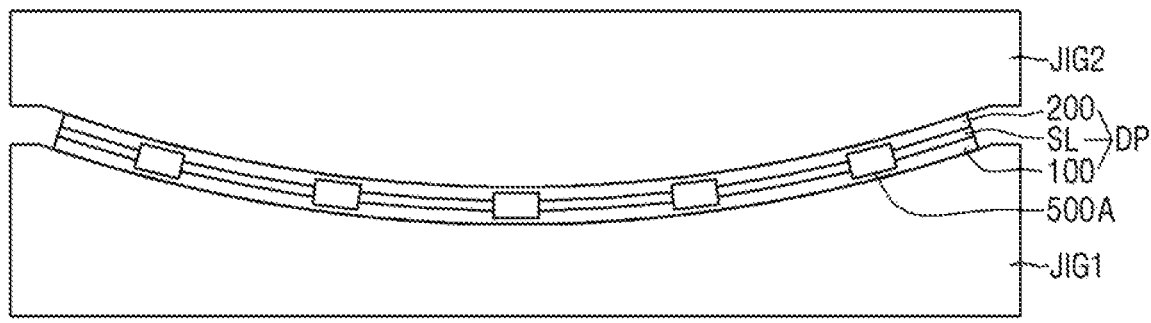
Figure 13:
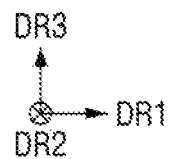
Figure 14:
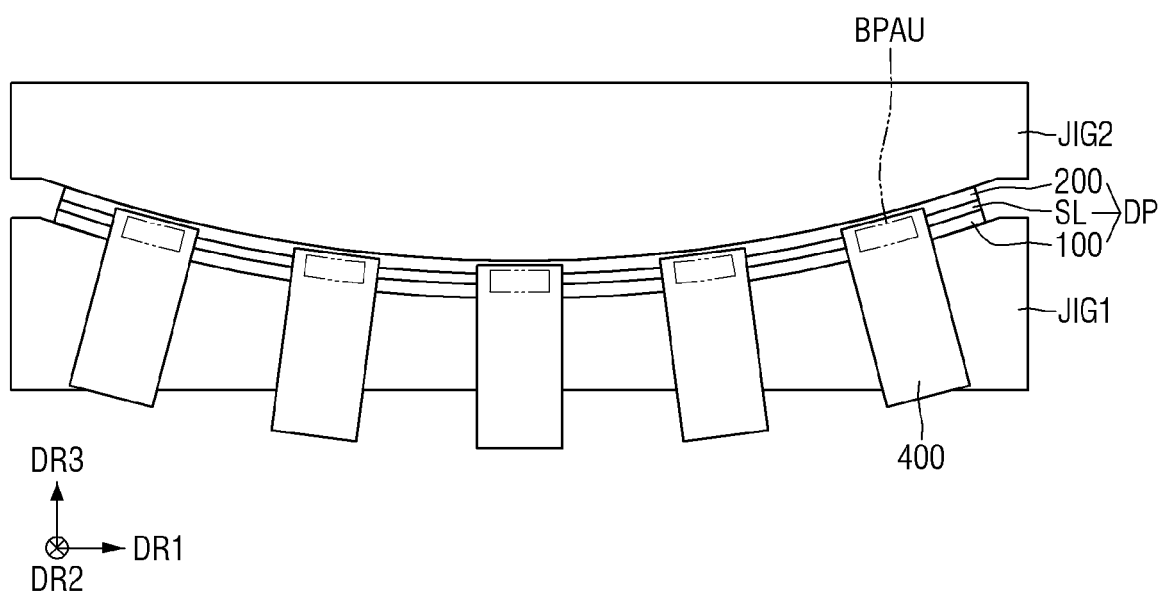

FIG. 11 is a flowchart for illustrating an exemplary embodiment of a method for fabricating the display device according to principles of the invention. FIGS. 12 to 14 are cross-sectional views for illustrating the method of fabricating the display device according to the flowchart of FIG. 11.

Referring to FIG. 11, the method of fabricating the display device according to some exemplary embodiments may include preparing a curvature jig (step S11), preparing a flat panel display (step S12), curving the flat panel display panel using the curvature jig (step S13), and attaching a flexible circuit board to the curved display panel (step S14). Although it is desired that the method is carried out according to the flowchart of FIG. 11, S12 may be carried out prior to S11 as desired.

Referring to FIGS. 11 and 12, in the preparing the curvature jig S11, the curvature jig JIG may include a first jig JIG1 and a second jig JIG2. The first jig JIG1 may include a generally curved concave surface, and the second jig JIG2 may include a generally curved convex surface.

The concave surface of the first jig JIG1 may be located at the center of the wide main surface of the first jig JIG1, and generally flat surfaces may be located at the both ends of the concave surface in the first direction DR1. The concave surface of the first jig JIG1 may be recessed from the generally flat surfaces. The first jig JIG1 may have a wholly concave surface, but the exemplary embodiments are not limited thereto. It may have a hole formed in the generally concave surface.

The generally convex surface of the second jig JIG2 may be located at the center of the wide main surface of the second jig JIG2, and generally flat surfaces may be located at the both ends of the convex surface in the first direction DR1. The generally convex surface of the second jig JIG2 may protrude from the flat surfaces. The second jig JIG2 may have a wholly convex surface, but the exemplary embodiments are not limited thereto. It may have a hole formed in the generally convex surface.

The generally concave surface of the first jig JIG1 and the generally convex surface of the second jig JIG2 may have complementary shapes to engage with each other. The curvature of the generally concave surface of the first jig JIG1 and the curvature of the generally convex surface of the second jig JIG2 may be determined in a variety of ways depending on the curvature to be formed using the curvature jig JIG.

It is desired that the width of the flat panel display panel DPF applied to the curvature jig may be smaller than the width of the concave region of the first jig JIG1 and the width of the convex region of the second jig JIG2.

When the generally concave surface of the first jig JIG1 is placed toward the upper side in the third direction DR3 and the generally convex surface of the second jig JIG2 is placed toward the lower side in the third direction DR3, the generally concave surface of the first jig JIG1 and the generally convex surface of the second jig JIG2 may engage with each other.

Although the first jig JIG1 includes the generally concave surface and the second jig JIG2 includes the generally convex surface in the drawings, this is merely illustrative. The first jig JIG1 may include a generally convex surface and the second jig JIG2 may include a generally concave surface. Although the first jig JIG1 is placed below the second jig JIG2 in the drawings, this is merely illustrative. The second jig JIG2 may be placed below the first jig JIG1.

In the preparing the flat display panel S12, the display panel DPF may include a first substrate 100F, a second substrate 200F, and a liquid-crystal layer and a sealant SLF interposed between the first substrate 100F and the second substrate 200F. The sealant SLF may be disposed along the edges of the first and second substrates 100F and 200F to prevent leakage of the liquid-crystal layer disposed between the first and second substrates 100F and 200F. The flat panel display panel DPF may not be curved. The flat panel display panel DPF may have, but is not limited to, a generally rectangular shape when viewed from the top. It may have a generally circular shape or other generally polygonal shape.

A flat connection pad may be disposed on a side surface of the flat panel display panel DPF. Although FIG. 12 shows the flat panel display panel DPF in which flat connection pad areas 500AF are disposed on the side surface for convenience of illustration, the flat connection pads may be arranged in each of the flat connection pad areas 500AF as described above with reference to FIG. 8.

The curving the flat panel display panel using the curvature jig S13 may include placing the flat panel display panel DPF on the generally concave surface of the first jig JIG1, pressing the flat panel display panel DPF using the second jig JIG2, and fixing the curved display panel DP to the curvature jig JIG.

During the process of placing the flat panel display panel DPF on the concave surface of the first jig JIG1, the flat panel display panel DPF may be supported substantially by the generally flat surfaces on the both ends of the generally concave surface of the first jig JIG1 in the first direction DR1. Accordingly, the flat panel display panel DPF may be spaced apart from the generally concave surface in the third direction DR3.

Referring to FIG. 13, compressing the flat panel display panel DPF using the second jig JIG2 may include pressing down the upper surface of the flat display panel DPF placed on the first jig JIG1 with the generally convex surface of the second jig JIG2 in the third direction DR3. By pressing down the flat panel display panel DPF using the second jig JIG2, the upper surface of the display panel DPF becomes curved, so that a curved display panel DP can be produced. In doing so, the edge of the display panel DP may be located more to the inside than the edge of the generally concave surface of the first jig JIG1, and may be located more to the inside than the edge of the generally convex surface of the second jig JIG2. It is, however, to be understood that the exemplary embodiments are not limited thereto.

The lower surface of the second jig JIG2 and the upper surface of the first jig JIG1 may have substantially the same shape. Specifically, the upper surface of the second substrate 200 may be curved to conform to the lower surface of the second jig JIG2. The lower surface of the first substrate 100 may be curved to conform to the upper surface of the first jig JIG1. It is, however, to be understood that the exemplary embodiments are not limited thereto. The upper surface of the first jig JIG1 may be spaced apart from the lower surface of the second jig JIG2 by the distance substantially equal to the thickness of the display panel DP.

As the display panel DP is curved, the array of the generally flat connection pads disposed on the side surface of the display panel DP is curved into the shape of the connection pads 500 shown in FIG. 8. That is to say, the flat connection pad areas 500AF may be curved into the connection pad areas 500A. The shape of each connection pads 500 may change, but the exemplary embodiments are not limited thereto. The shape of each connection pad 500 does not change, but only the arrangement of the connection pads 500 may change.

If the pressure applied to the curved display panel DPF using the second jig JIG2 is removed, the curved display panel DPF may be restored to the flat panel display panel again. For this reason, the curvature jig has to be fixed so that the display panel DP remains curved.

A fixing member may be used for fixing the curvature jig. The fixing member may fix the first jig JIG1 and the second jig JIG2. Specifically, the first jig JIG1 and the second jig JIG2 may be fixed such that the display between the upper surface of the first jig JIG1 and the lower surface of the second jig JIG2 is maintained. By doing so, the distance between the upper surface of the first jig JIG1 and the lower surface of the second jig JIG2 can be maintained substantially equal to the thickness of the display panel DP.

The fixing member may be disposed across the first jig JIG1 and the second jig JIG2. For example, the fixing member may be disposed across a side surface of the first jig JIG1 and a side surface of the second jig JIG2, or across the lower surface of the first jig JIG1 and the upper surface of the second jig JIG2. It is, however, to be understood that the exemplary embodiments are not limited thereto.

Referring to FIGS. 6, 11 and 14, after curving the flat panel display panel using the curvature jig S13, attaching of the flexible circuit boards to the curved display panel S14 may be carried out. As described above, the flexible circuit boards 400 may be attached to the side surface of the curved display panel DP. By doing so, the flexible circuit boards 400 may be electrically connected to the display panel DP.

Specifically, the flexible circuit boards 400 may be attached to the connection pads 500 of the display panel DP through the adhesive films 600. For example, an upper bump BPU of the flexible circuit board 400 and the display panel DP may be electrically connected by an outer lead bonding (OLB) using the adhesive film 600. The adhesive film 600 may be disposed to cover the entire connection pad 500 of the display panel DP, but the exemplary embodiments are not limited thereto. A part of the connection pad 500 of the display panel DP may be exposed.

According to the exemplary method of fabricating the display device 1, the flexible circuit boards 400 are attached to the side surface of the curved display panel DP to significantly reduce the bezel of the display device 1. When one side and the other side of the upper bump area BPAU in the third direction DR3 which are included in the flexible circuit board 400 are generally parallel to the edge of the side surface of the curved display panel DP, the curved display panel DP and the flexible circuit boards 400 can be attached together reliably.

Figure 15:
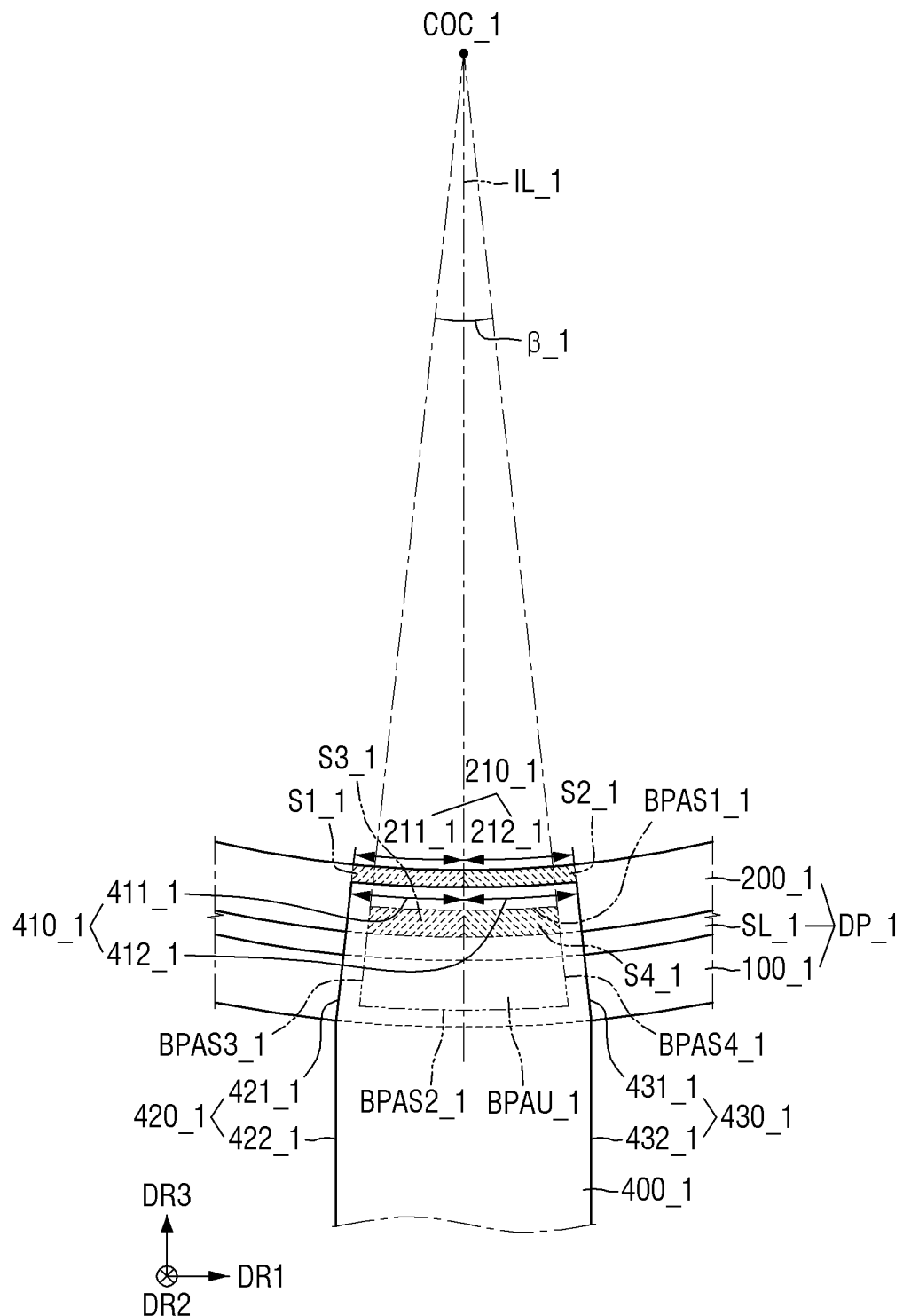
FIG. 15 is an enlarged view of another exemplary embodiment of the area of a display panel with an attached flexible circuit board constructed according to principles of the invention.

FIG. 15 is an enlarged view of another exemplary embodiment of the area of a display panel with an attached flexible circuit board constructed according to principles of the invention. Features similar to those described above with reference to FIGS. 1 to 10 will be omitted to avoid redundancy.

The exemplary embodiment of FIG. 15 is different from the exemplary embodiment of FIGS. 9 and 10 in that the shape of a flexible circuit board 400_1 overlapping a display panel DP_1 in the second direction DR2 is different.

A left side 420_1 of the flexible circuit board 400_1 may include a first left side 421_1 overlapping a side surface of the display panel DP_1, and a second left side 422_1 non-overlapping the side surface of the display panel DP_1. A right side 430_1 of the flexible circuit board 400_1 may include a first right side 431_1 overlapping the side surface of the display panel DP_1 and a second right side 432_1 non-overlapping the side surface of the display panel DP_1. The first left side 421_1 of the flexible circuit board 400_1 faces a center of curvature COC_1 of the display panel DP_1 and may be generally perpendicular to an upper side 210_1 of a second substrate 200_1. The first right side 431_1 of the flexible circuit board 400_1 faces the center of curvature COC_1 of the display panel DP_1 and may be generally perpendicular to the upper side 210_1 of the second substrate 200_1. The spacing between the first left side 421_1 and the first right side 431_1 of the flexible circuit board 400_1 may decrease toward the center of curvature COC_1 of the second substrate 200_1. It is, however, to be understood that the exemplary embodiments are not limited thereto.

In addition, an upper side 410_1 of the flexible circuit board 400_1 (or one edge in the third direction DR3) may have a curved shape. The spacing distance between the upper side 410_1 of the flexible circuit board 400_1 and the upper side 210_1 of the second substrate 200_1 may be substantially constant across different regions. Therefore, the tangent line of the upper side 210_1 of the flexible circuit board 400_1 at the point where the upper side 210_1 of the flexible circuit board 400_1 intersects the first left side 421_1 may be generally perpendicular to the first left side 421_1. The tangent line of the upper side 210_1 of the flexible circuit board 400_1 at the point where the upper side 210_1 of the flexible circuit board 400_1 intersects the first right side 431_1 may be generally perpendicular to the first right side 431_1.

In the display device 1_1 according to the exemplary embodiments, a flexible circuit board 400_1 is attached to the side surface of the curved display panel DP_1, so that the bezel can be reduced significantly. When one side and the other side of the upper bump area BPAU_1 in the third direction DR3 which are included in the flexible circuit board 400_1 are generally parallel to the edge of the side surface of the curved display panel DP_1, the curved display panel DP_1 and the flexible circuit boards 400_1 can be attached together reliably.

According to the exemplary embodiments, it is possible to significantly reduce the bezel of a curved display device.

Figure 16:
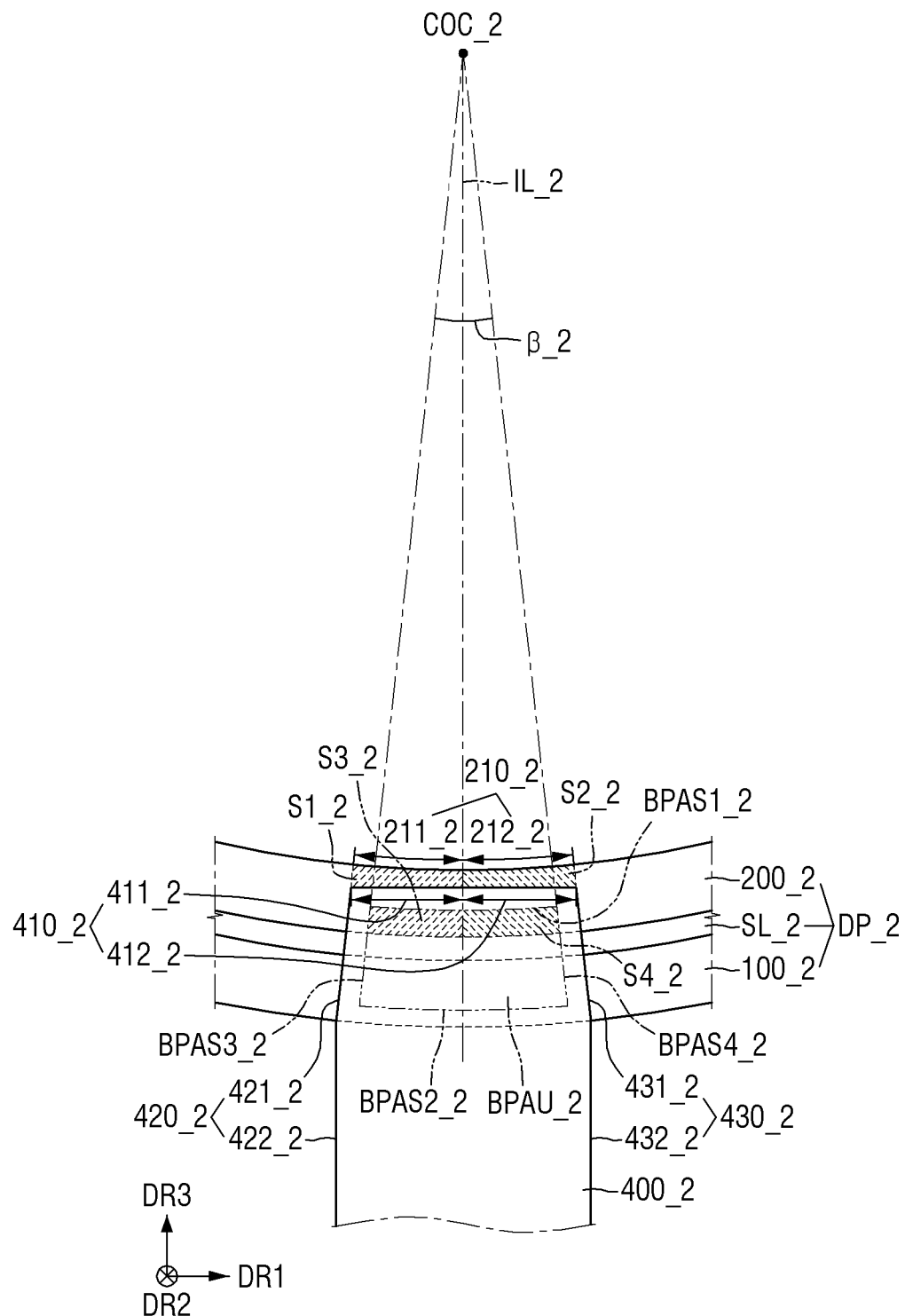
FIG. 16 is an enlarged view of a further exemplary embodiment of the area of a display panel with an attached flexible circuit board constructed according to principles of the invention constructed according to principles of the invention.

FIG. 16 is an enlarged view of a further exemplary embodiment of the area of a display panel with an attached flexible circuit board constructed according to principles of the invention constructed according to principles of the invention.

The exemplary embodiment of FIG. 16 is generally different from the exemplary embodiment of FIGS. 9 and 10 in that the shape of a flexible circuit board 400_2 overlapping a display panel DP_2 in the second direction DR2 is different.

A left side 420_2 of the flexible circuit board 400_2 may include a first left side 421_2 overlapping a side surface of the display panel DP_2, and a second left side 422_2 non-overlapping the side surface of the display panel DP_2. A right side 430_2 of the flexible circuit board 400_2 may include a first right side 431_2 overlapping the side surface of the display panel DP_2 and a second right side 432_2 non-overlapping the side surface of the display panel DP_2. The imaginary line extending along the first left side 421_2 of the flexible circuit board 400_2 faces a center of curvature COC_2 of the display panel DP_2 and may be perpendicular to an upper side 210_2 of a second substrate 200_2. The imaginary line extending along the first left side 431_2 of the flexible circuit board 400_2 faces the center of curvature COC_2 of the display panel DP_2 and may be generally perpendicular to the upper side 210_2 of the second substrate 200_2.

The upper side 410_2 of the flexible circuit board 400_2 may extend in the first direction DR1 and may be perpendicular to a center line IL_2. The exemplary embodiment of FIG. 16 is different from the exemplary embodiment of FIG. 15 in that the shape of the upper side 410_2 of the flexible circuit board 400_2 is a straight line rather than a curve.

In the display device 1_2 according to the exemplary embodiments, a flexible circuit board 400_2 is attached to the side surface of the curved display panel DP_2, so that the bezel can be reduced significantly. When one side and the other side of the upper bump area BPAU_2 in the third direction DR3 which are included in the flexible circuit board 400_2 are generally parallel to the edge of the side surface of the curved display panel DP_2, the curved display panel DP_2 and the flexible circuit boards 400_2 can be attached together reliably.

According to the exemplary embodiments, it is possible to significantly reduce the bezel of a curved display device.

Figure 17:
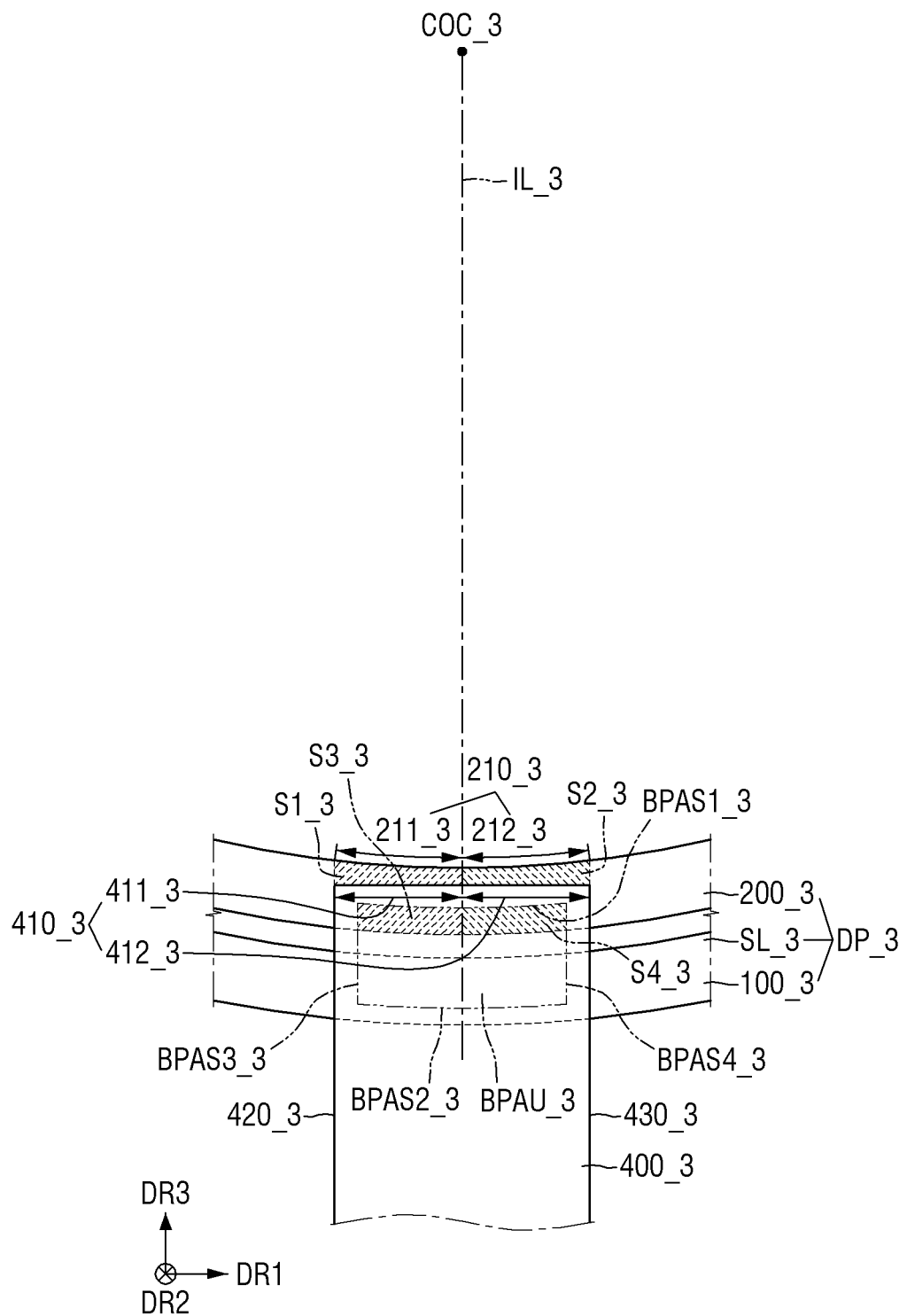
FIG. 17 is an enlarged view of yet another exemplary embodiment of the area of a display panel with an attached flexible circuit board constructed according to principles of the invention.
Figure 18:
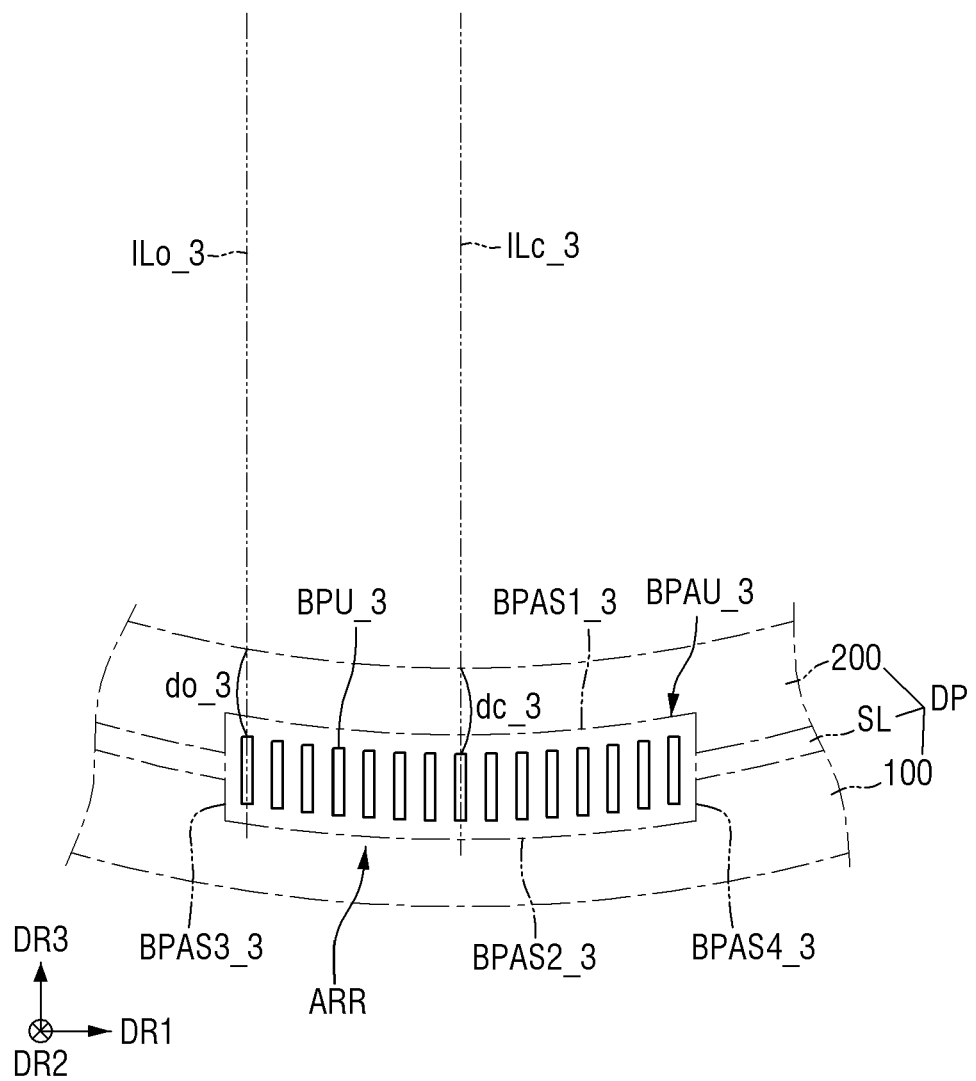
FIG. 18 is a plan view illustrating an exemplary embodiment of the upper bump area of the flexible circuit board of FIG. 17.

FIG. 17 is an enlarged view of yet another exemplary embodiment of the area of a display panel with an attached flexible circuit board constructed according to principles of the invention. FIG. 18 is a plan view illustrating an exemplary embodiment of the upper bump area of the flexible circuit board of FIG. 17.

The exemplary embodiment of FIGS. 17 and 18 is different from the exemplary embodiment of FIGS. 7 and 10 in that the shape of an upper bump area BPAU_3 overlapping a display panel DP_3 in the second direction DR2 is different.

A plurality of upper bumps BPU_3 disposed on a flexible circuit board 400_3 may be arranged with the same curvature as the curvature of a side edge of a second substrate 200_3. The length of an array ARR of the upper bumps BPU_3 in the thickness direction of the second substrate 200_3 may be constant. The upper bump area BPAU_3 may be defined as the area from one edge of the upper bump BPU_3 disposed at one end of the array ARR of the upper bumps BPU to the opposite edge of the upper bump BPU_3 disposed at the opposite end along the array ARR of the upper bumps BPU_3.

The upper bump area BPAU_3 may be surrounded by a first side BPAS1_3 disposed on the upper side in the third direction DR3, a second side BPAS2_3 disposed on the lower side in the third side DR3 from the first side BPAS_3, a third side BPAS3_3 connecting the first side BPAS1_3 with the second side BPAS2_3 on the other side in the first direction DR1, and a fourth side BPAS4_3 connecting the first side BPAS1_3 with the second side BPAS2_3 on the one side in the first direction DR1. The spacing distance between the first side BPAS1_3 and the second side BPAS2_3 may be substantially uniform across different regions. The first side BPAS1_3 may be a line connecting the edges of the upper bumps BPU_3 on the upper side in the third direction DR3. The second side BPAS2_3 may be a line connecting the edges of the upper bumps BPU_3 on the lower side in the third direction DR3. The third side BPAS3_3 may be the edge of the outermost upper bump BPU_3 disposed on the other side in the first direction DR1. The fourth side BPAS4_3 may be the edge of the outermost upper bump BPU_3 disposed on the one side in the first direction DR1. Although the first to fourth sides BPAS1 to BPAS4_3 are spaced apart from the sides of the upper bumps BPU in the example shown in FIG. 18, this is merely illustrative.

The first and second sides BPAS1 and BPAS2_3 may be curved lines generally parallel to the display panel DP_3. For example, the first and second sides BPAS1 and BPAS2_3 may be equally spaced apart from the edge of the side surface of each of the first substrate 100_3 and the second substrate 200_3. The length of the first side BPAS1 may be substantially equal to the length of the second side BPAS2. It is, however, to be understood that the exemplary embodiments are not limited thereto.

According to some exemplary embodiments, the upper bumps BPU_3 each may have a generally rectangular shape and may extend in the same direction. In addition, one edge and the other edge of the upper bumps BPU_3 included in the column of one upper bump BPU_3 may be aligned side by side in the third direction DR3. It is, however, to be understood that the exemplary embodiments are not limited thereto.

The tangent line of the first side BPAS1_3 at the point at which the first side BPAS1_3 of the upper bump area BPAU_3 intersects the center line IL_3 may be generally perpendicular to the center line IL_3. Likewise, the tangent line of the second side BPAS2_3 at the point at which the second side BPAS2_3 intersects the center line IL_3 may be generally perpendicular to the center line IL_3. It is, however, to be understood that the exemplary embodiments are not limited thereto.

The third side BPAS3_3 of the upper bump area BPAU_3 may be generally parallel to each of the left side 420_3 and the right side 430_3 of the flexible circuit board 400_3. In addition, the fourth side BPAS4_3 of the upper bump area BPAU_3 may be generally parallel to each of the left side 420_3 and the right side 430_3 of the flexible circuit board 400_3. It is, however, to be understood that the exemplary embodiments are not limited thereto.

In the display device 1_3 according to the exemplary embodiments, a flexible circuit board 400_3 is attached to the side surface of the curved display panel DP_3, so that the bezel can be reduced significantly. When one side and the other side of the upper bump area BPAU_3 in the third direction DR3 which are included in the flexible circuit board 400_3 are generally parallel to the edge of the side surface of the curved display panel DP_3, the curved display panel DP_3 and the flexible circuit boards 400_3 can be attached together reliably.

According to the exemplary embodiments, it is possible to significantly reduce the bezel of a curved display device.

Figure 19:
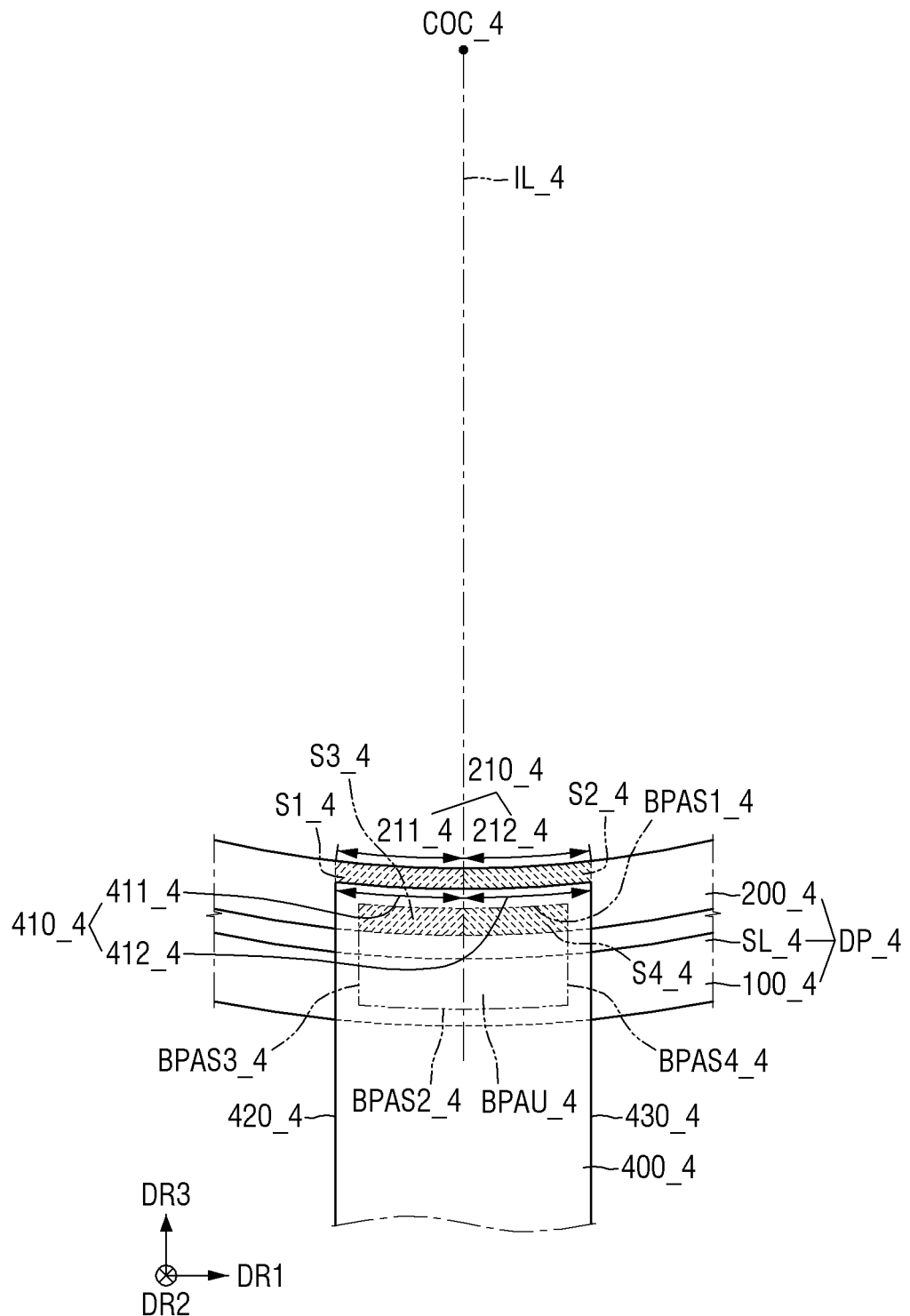
FIG. 19 is an enlarged view of still another exemplary embodiment the area of a display panel with an attached flexible circuit board constructed according to principles of the invention.

FIG. 19 is an enlarged view of still another exemplary embodiment the area of a display panel with an attached flexible circuit board constructed according to principles of the invention.

The exemplary embodiment of FIG. 19 is different from the exemplary embodiment of FIGS. 7 and 10 in that the shapes of an upper bump area BPAU_4 and a flexible circuit board 400_4 overlapping a display panel DP_4 in the second direction DR2 is different.

The shape of the upper bump area BPAU_4 according to the exemplary embodiments are identical to that described above with reference to FIG. 17. The upper side 410_4 of the flexible circuit board 400_4 (or the edge on the upper side in the third direction DR3) and the upper side 210_4 of the second substrate 200_4 (or the edge on the upper side in the third direction DR3) are arranged side by side.

In addition, the upper side 410_4 (or the edge on the upper side in the third direction DR3) of the flexible circuit board 400_4 may be generally parallel to the first and second sides BPAS1_4 and BPAS2_4 of the upper bump area BPAU_4.

In the display device 1_4 according to the exemplary embodiments, a flexible circuit board 400_4 is attached to the side surface of the curved display panel DP_4, so that the bezel can be reduced significantly. When one side and the other side of the upper bump area BPAU_4 in the third direction DR3 which are included in the flexible circuit board 400_4 are generally parallel to the edge of the side surface of the curved display panel DP_4, the curved display panel DP_4 and the flexible circuit boards 400_4 can be attached together reliably.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a curved first substrate;
a second substrate opposing the first substrate;
a plurality of connection pads disposed on a side surface of the first substrate and a side surface of the second substrate; and
at least one flexible circuit board including a plurality of projections respectively coupled to the plurality of connection pads,
wherein:
the plurality of projections forms an array of projections along an edge of the side surface of the second substrate;
the projections comprise bumps extending in different directions; and
angles defined by imaginary lines of adjacent ones of the bumps are substantially constant throughout different regions, wherein the imaginary lines extend in the directions in which the respective bumps extend.

2. The display device of claim 1, wherein the at least one flexible circuit board further comprises a projection area defined as an area from an edge of a projection disposed at an end of the array of projections to an edge of a projection disposed at another end of the array of projections along the array of projections,
wherein the projection area partially overlaps the side surface of the second substrate,
wherein the overlapping area comprises a first area disposed on one side of an imaginary center line and a second area disposed on the other side of the imaginary center line, the imaginary center line substantially equally dividing the flexible circuit board and extending in a length direction of the flexible circuit board, and
wherein the first area is substantially equal to the second area.

3. The display device of claim 2, wherein the first area and the second area have shapes that are substantially symmetrical with respect to the imaginary center line.

4. The display device of claim 2, wherein the projection area comprises a bump area and the projections comprise bumps disposed substantially symmetrically with respect to the imaginary center line in the array of the bumps.

5. The display device of claim 2, wherein a spacing between an outer edge of the projection disposed at one end of the array of projections and an outer edge of the projection disposed at the other end of the array of projections is substantially uniform throughout different regions.

6. The display device of claim 1, further comprising adhesive films disposed between the projections and the connection pads.

7. The display device of claim 6, wherein the adhesive films are disposed to cover the entire connection pads.

8. The display device of claim 1, wherein the array of projections has a substantially constant length in a thickness of the second substrate.

9. The display device of claim 1, wherein a spacing between one edge and the other edge of the flexible circuit board in a direction of the array of projections is substantially uniform throughout different regions.

10. The display device of claim 1, wherein the at least one flexible circuit board comprises a plurality of flexible circuit boards, and
wherein the plurality of flexible circuit boards has a curvature substantially equal to a curvature of the edge of the side surface of the second substrate.

11. The display device of claim 10, wherein a spacing between adjacent ones of the plurality of flexible circuit boards is substantially uniform.

12. The display device of claim 1, wherein the plurality of projections forms the array of projections with substantially a same curvature.

13. A display device comprising:
a curved first substrate;
a second substrate opposing the first substrate;
a plurality of connection pads disposed on a side surface of the first substrate and a side surface of the second substrate; and
at least one flexible circuit board including a plurality of projections respectively coupled to the plurality of connection pads,
wherein:
the plurality of projections forms an array of projections along an edge of the side surface of the second substrate;
the at least one flexible circuit board further comprises a projection area defined as an area from an edge of a projection disposed at an end of the array of projections to an edge of a projection disposed at another end of the array of projections along the array of projections;

the projection area partially overlaps the side surface of the second substrate;

the overlapping area comprises a first area disposed on one side of an imaginary center line and a second area disposed on the other side of the imaginary center line, the imaginary center line substantially equally dividing the flexible circuit board and extending in a length direction of the flexible circuit board;

the first area is substantially equal to the second area; and a spacing between an outer edge of the projection disposed at one end of the array of projections and an outer edge of the projection disposed at the other end of the array of projections decreases toward a center of curvature of the second substrate.

14. A display device comprising:
a curved first substrate;
a second substrate opposing the first substrate;
a plurality of connection pads disposed on a side surface of the first substrate and a side surface of the second substrate; and
at least one flexible circuit board including a plurality of projections respectively coupled to the plurality of connection pads, wherein:

the plurality of projections forms an array of projections along an edge of the side surface of the second substrate; and a spacing between edges of the flexible circuit board in a direction of the array of projections decreases toward a center of curvature of the second substrate in an area where the second substrate overlaps with the flexible circuit board.

* * * * *